(12) United States Patent
Tanaka

(10) Patent No.: US 8,772,771 B2
(45) Date of Patent: Jul. 8, 2014

(54) METHOD FOR MANUFACTURING SEMICONDUCTOR DEVICE

(71) Applicant: Semiconductor Energy Laboratory Co., Ltd., Atsugi (JP)

(72) Inventor: Tetsuhiro Tanaka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/870,370

(22) Filed: Apr. 25, 2013

(65) Prior Publication Data

US 2013/0285051 A1 Oct. 31, 2013

(30) Foreign Application Priority Data

Apr. 30, 2012 (JP) ................. 2012-104279

(51) Int. Cl.
*H01L 29/10* (2006.01)
*H01L 29/12* (2006.01)
*H01L 21/00* (2006.01)
*H01L 21/16* (2006.01)

(52) U.S. Cl.
USPC ........................... 257/43; 438/104

(58) Field of Classification Search
USPC ........................... 438/104; 257/43
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,531,727 B2 * | 3/2003 | Forbes et al. | 257/302 |
| 6,563,174 B2 | 5/2003 | Kawasaki et al. | |
| 6,632,712 B1 * | 10/2003 | Ang et al. | 438/212 |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

"AIST Announces World's Thinnest Vertical-Type Double-Gate MOSFET Using Newly Discovered Process", AIST Today international Edition, 2003, No. 8, pp. 10-12.

(Continued)

*Primary Examiner* — Karen Kusumakar
(74) *Attorney, Agent, or Firm* — Eric J. Robinson; Robinson Intellectual Property Law Office, P.C.

(57) ABSTRACT

Miniaturized transistors having high and stable electric characteristics using high precision microfabrication are provided with high yield. Further, high performance, high reliability, and high productivity also of a semiconductor device including the transistor are achieved. A semiconductor device includes a vertical transistor in which a first electrode layer, a first oxide film containing indium, gallium, zinc, and nitrogen as main components, an oxide semiconductor film containing indium, gallium, and zinc as main components, a second oxide film containing indium, gallium, zinc, and nitrogen as main components, and a second electrode layer are stacked in this order, and a first gate insulating film and a first gate electrode layer are provided at one side of the columnar oxide semiconductor film and a second gate insulating film and a second gate electrode layer are provided at the other side of the columnar oxide semiconductor film.

19 Claims, 14 Drawing Sheets

(56) References Cited

U.S. PATENT DOCUMENTS

| | | | |
|---|---|---|---|
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,977,736 B2 * | 7/2011 | Kim et al. | 257/329 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0007601 A1 * | 1/2007 | Hsu et al. | 257/368 |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117074 A1 * | 5/2010 | Yamazaki et al. | 257/43 |
| 2011/0101356 A1 | 5/2011 | Yamazaki | |
| 2012/0224438 A1 * | 9/2012 | Inaba | 365/189.011 |
| 2012/0241826 A1 * | 9/2012 | Satoh et al. | 257/295 |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2003-101012 A | 4/2003 | |
| JP | 2004-103957 A | 4/2004 | |
| JP | 2004-273614 A | 9/2004 | |
| JP | 2004-273732 A | 9/2004 | |
| JP | 2011-181801 A | 9/2011 | |
| WO | WO-2004/114391 | 12/2004 | |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No, 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

(56) References Cited

OTHER PUBLICATIONS

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Fiat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display

(56) References Cited

OTHER PUBLICATIONS

Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFe2O4, and YB2Fe3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amporphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW'08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors with Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

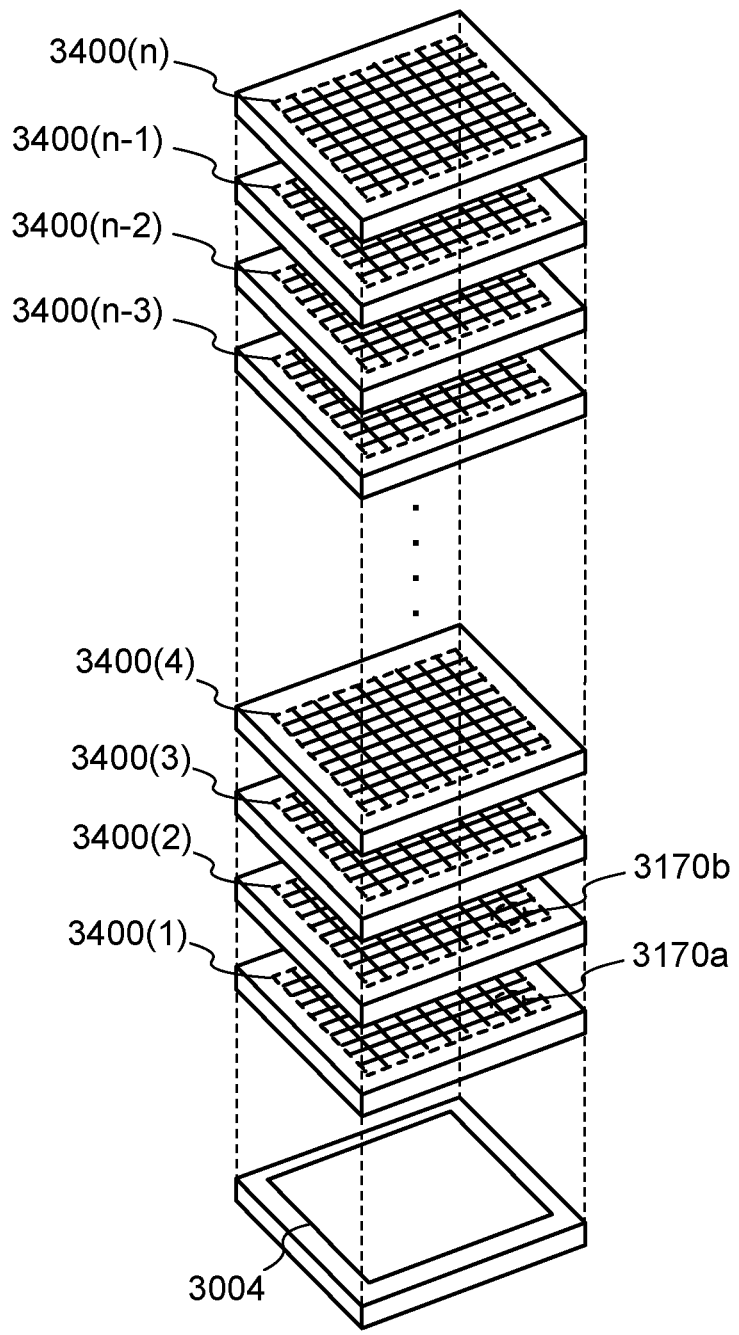

METHOD FOR MANUFACTURING SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and electronic equipment are all semiconductor devices.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device).

A silicon-based semiconductor material is widely known as a material for a semiconductor thin film applicable to a transistor. As another material, an oxide semiconductor has been attracting attention.

For example, a transistor including a semiconductor layer formed using an amorphous oxide containing indium (In), gallium (Ga), and zinc (Zn) (In—Ga—Zn—O-based amorphous oxide) is disclosed (e.g., see Patent Document 1).

Further, in particular, for an electronic device with high integration and high performance, a transistor is required to be miniaturized, and a vertical transistor structure in which reduction in an area occupied by the transistor is achieved has been proposed (e.g., see Patent Document 2).

REFERENCE

Patent Document

[Patent Document 1] Japanese Published Patent Application No. 2011-181801

[Patent Document 2] Japanese Published Patent Application No. 2003-101012

SUMMARY OF THE INVENTION

However, it is concerned that yield of transistors in the manufacturing process is decreased due to miniaturization thereof.

An object of one embodiment of the present invention is to provide a miniaturized transistor having high and stable electric characteristics using high precision microfabrication with high yield.

Another object of one embodiment of the present invention is to achieve high performance, high reliability, and high productivity also of a semiconductor device including the transistor.

A transistor included in a semiconductor device is a vertical transistor in which a first electrode layer, a first oxide film containing indium, gallium, zinc, and nitrogen as main components, an oxide semiconductor film containing indium, gallium, and zinc as main components, a second oxide film containing indium, gallium, zinc, and nitrogen as main components, and a second electrode layer are stacked in this order, a first gate insulating film and a first gate electrode layer are provided at one side of the columnar oxide semiconductor film, and a second gate insulating film and a second gate electrode layer are provided at the other side of the columnar oxide semiconductor film.

In the transistor, the first electrode layer and the second electrode layer function as a source electrode layer and a drain electrode layer, and the first oxide film and the second oxide film are low-resistance regions having lower resistance than the oxide semiconductor film and function as a source region and a drain region.

With the low-resistance source region or the low-resistance drain region between which a channel formation region is provided in the channel length direction, on-state characteristics (e.g., on-state current and field-effect mobility) of the transistor are increased, which enables high-speed operation and high-speed response of the transistor.

In the etching step of the oxide semiconductor film containing indium, gallium, and zinc as main components of the transistor, a mixed solution of acetic acid, nitric acid, and phosphoric acid is used and the second oxide film containing indium, gallium, zinc, and nitrogen as main components, whose etching rate is lower than that of the oxide semiconductor film, is used as a mask to the mixed solution.

The second oxide film containing indium, gallium, zinc, and nitrogen as main components is etched using the mixed solution of acetic acid, nitric acid, and phosphoric acid. However, the etching rate of the second oxide film is lower than that of the oxide semiconductor film containing indium, gallium, and zinc as main components; therefore, the second oxide film can be used as a mask which is gradually receded (reduced) in the width direction in the etching step. The mask is reduced in the width direction, so that the oxide semiconductor film containing indium, gallium, and zinc as main components is etched in the width direction. As a result, the oxide semiconductor film can be microfabricated into a columnar object with a small width.

By using such a columnar object with a small width as an oxide semiconductor film, the transistor can be miniaturized, so that a semiconductor device in which transistors are integrated with high density can be manufactured.

One embodiment of a structure of the invention disclosed in this specification is a method for manufacturing a semiconductor device including the steps of forming a first electrode layer, stacking a first oxide film containing indium, gallium, zinc, and nitrogen as main components, an oxide semiconductor film containing indium, gallium, and zinc as main components, and a second oxide film containing indium, gallium, zinc, and nitrogen as main components in this order, forming a column object of the oxide semiconductor film and the second oxide film by etching the oxide semiconductor film in an etching step using a mixed solution of acetic acid, nitric acid, and phosphoric acid using the second oxide film as a mask while being recessed in a line width direction, the column object standing over the first oxide film, forming a gate insulating film covering at least a side of the oxide semiconductor film of the column object and a first gate electrode layer and a second gate electrode layer which overlap with the oxide semiconductor film of the column object with the gate insulating film provided between the oxide semiconductor film and the first gate electrode layer and between the oxide semiconductor film and the second gate electrode layer and facing each other by stacking an insulating film and an island-shaped conductive film over the column object and anisotropically etching the insulating film and the island-shaped conductive film, and forming a second electrode layer electrically connected to the second oxide film of the column object.

Another embodiment of the present invention is the method for manufacturing a semiconductor device in the above structure, an interlayer insulating film is formed over the first electrode layer, the first oxide film, the column object, the gate insulating film, the first gate electrode layer, and the second gate electrode layer, the second oxide film of the column object is exposed by selectively removing the interlayer insulating film, and the second electrode layer is formed in contact with the exposed second oxide film.

Another embodiment of the present invention is the method for manufacturing a semiconductor device in the above structure, in which the first oxide film and the second oxide film have a higher resistance property to etching using the mixed solution of acetic acid, nitric acid, and phosphoric acid and the etching speed is later than the oxide semiconductor film.

Another embodiment of the present invention is the method for manufacturing a semiconductor device in the above structure, the first oxide film and the second oxide film have lower resistance than the oxide semiconductor film, the oxide semiconductor film functions as a channel formation region, and the first oxide film and the second oxide film function as a source region and a drain region.

Another embodiment of the present invention is the method for manufacturing a semiconductor device in the above structure, in which a resist mask is formed over the oxide semiconductor film and the second oxide film before the etching step and the oxide semiconductor film and the second oxide film are each processed into an island shape through an anisotropic etching step using the resist mask.

The first oxide film and the second oxide film can be formed by a sputtering method in which a target containing indium, gallium, zinc, and nitrogen as main components is used. Further, the first oxide film and the second oxide film can be formed by forming an oxide film containing indium, gallium, and zinc as main components and introducing nitrogen to the oxide film.

As a method for introducing nitrogen, plasma treatment, an ion implantation method, an ion doping method, a plasma immersion ion implantation method, or the like can be used.

One embodiment of the present invention relates to a semiconductor device including a transistor or a semiconductor device including a circuit which is formed by using a transistor. For example, one embodiment of the present invention relates to a semiconductor device including a transistor in which a channel formation region is formed using an oxide semiconductor or a semiconductor device including a circuit which is formed by using such a transistor. For example, one embodiment of the present invention relates to an LSI, a CPU, a power device mounted in a power circuit, a semiconductor integrated circuit including a memory, a thyristor, a converter, an image sensor, or the like, an electro-optical device typified by a liquid crystal display panel, a light-emitting display device including a light-emitting element, or an electronic device including the aforementioned device as a component.

A miniaturized transistor having high and stable electric characteristics using high precision microfabrication can be provided with high yield.

Further, also in a semiconductor device including the transistor, high performance, high reliability, and high productivity can be achieved.

BRIEF DESCRIPTION OF THE DRAWINGS

In the accompanying drawings:

FIG. 9 is a perspective view illustrating one embodiment of a semiconductor device;

DETAILED DESCRIPTION OF THE INVENTION

Figure 1A:
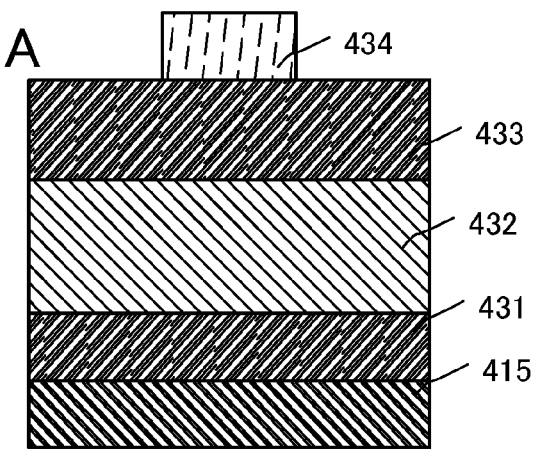
FIGS. 1A to 1D are cross-sectional views illustrating one embodiment of a method for manufacturing a semiconductor device.
Figure 1B:
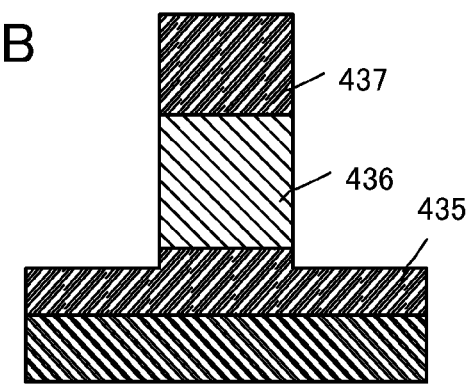

Hereinafter, embodiments and an example of the invention disclosed in this specification will be described in detail with reference to the accompanying drawings. Note that the invention disclosed in this specification is not limited to the following description, and it is easily understood by those skilled in the art that modes and details can be variously changed without departing from the spirit and the scope of the invention. Further, the invention disclosed in this specification is not construed as being limited to the description of the following embodiments or example. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, an embodiment of a semiconductor device and a manufacturing method thereof will be described with reference to FIGS. 1A to 1D, FIGS. 2A to 2D, FIGS. 3A to 3D, FIGS. 4A and 4B, and FIGS. 5A and 5B. In this embodiment, a transistor including an oxide semiconductor film will be described as an example of the semiconductor device.

Transistors 410a, 410b, and 410c described in this embodiment are each a vertical transistor in which a first electrode layer 415, a first oxide film 414 containing indium, gallium, zinc, and nitrogen as main components, an oxide semiconductor film 403 containing indium, gallium, and zinc as main components, a second oxide film 424 containing indium, gallium, zinc, and nitrogen as main components, and a second electrode layer 425 are stacked in this order, a first gate insulating film 402a and a first gate electrode layer 401a are provided at one side of the columnar oxide semiconductor film 403, and a second gate insulating film 402b and a second gate electrode layer 401b are provided at the other side of the columnar oxide semiconductor film 403.

Therefore, in the oxide semiconductor film 403 of the transistors 410a, 410b, and 410c, a channel length direction is the up and down direction in the drawing, that is, a direction substantially orthogonal to a surface of the first electrode layer 415.

An example of a method for manufacturing the semiconductor device including the transistor 410a, the transistor 410b, or the transistor 410c is illustrated in FIGS. 1A to 1D, FIGS. 2A to 2D, and FIGS. 3A to 3D.

First, a conductive film is formed over a substrate having an insulating surface (not illustrated) by a sputtering method, an evaporation method, or the like and is etched, and the first electrode layer 415 functioning as a source electrode layer or a drain electrode layer is formed.

There is no particular limitation on the substrate that can be used as the substrate having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate, or the substrate provided with a semiconductor element can be used as the substrate.

Further, a flexible substrate may be used as the substrate to manufacture the semiconductor device. In order to manufacture a flexible semiconductor device, the transistor 410a, 410b, or 410c may be directly formed over a flexible substrate. Alternatively, the transistor 410a, 410b, or 410c may be formed over a formation substrate, and then, the transistor 410a, 410b, or 410c may be separated and transferred to a flexible substrate. Note that in order to separate the transistor 410a, 410b, or 410c including the oxide semiconductor film from the manufacturing substrate and transfer it to the flexible substrate, a separation layer may be provided between the manufacturing substrate and the transistor 410a, 410b, or 410c.

For the conductive film for forming the first electrode layer 415, for example, a metal film containing an element selected from Al, Cr, Cu, Ta, Ti, Mo, and W, a metal nitride film containing any of the above elements as a component (such as a titanium nitride film, a molybdenum nitride film, or a tungsten nitride film), or the like can be used. A metal film having a high melting point such as Ti, Mo, W, or the like or a metal nitride film of any of these elements (such as a titanium nitride film, a molybdenum nitride film, and a tungsten nitride film) may be stacked on one of or both of a lower side or an upper side of a metal film of Al, Cu, or the like. Alternatively, the conductive film for forming the first electrode layer 415 may be formed using conductive metal oxide. Indium oxide ($In_2O_3$), tin oxide ($SnO_2$), zinc oxide (ZnO), indium oxide-tin oxide ($In_2O_3$—$SnO_2$), an alloy of indium oxide and zinc oxide ($In_2O_3$—ZnO), or any of these metal oxide materials containing silicon oxide can be used as the conductive metal oxide.

Next, a first oxide film 431 containing indium, gallium, zinc, and nitrogen as main components, an oxide semiconductor film 432 containing indium, gallium, and zinc as main components, and a second oxide film 433 containing indium, gallium, zinc, and nitrogen as main components are stacked in this order.

There is no limitation on the ratio of In, Ga, and Zn in oxide semiconductors included in the first oxide film 431 containing indium, gallium, zinc, and nitrogen as main components, the oxide semiconductor film 432 containing indium, gallium, and zinc as main components, and the second oxide film 433 containing indium, gallium, zinc, and nitrogen as main components.

For example, an oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or an oxide having a composition in the neighborhood of the above composition can be used.

Without limitation to the materials given above, a material with an appropriate composition may be used as the oxide semiconductors included in the first oxide film 431 containing indium, gallium, zinc, and nitrogen as main components, the oxide semiconductor film 432 containing indium, gallium, and zinc as main components, and the second oxide film 433 containing indium, gallium, zinc, and nitrogen as main components in accordance with required semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

The first oxide film 431 containing indium, gallium, zinc, and nitrogen as main components, the oxide semiconductor film 432 containing indium, gallium, and zinc as main components, and the second oxide film 433 containing indium, gallium, zinc, and nitrogen as main components are in a single crystal state, a polycrystalline (also referred to as polycrystal) state, an amorphous state, or the like.

The first oxide film 431, the oxide semiconductor film 432, and the second oxide film 433 may be in a non-single-crystal state, for example. The non-single-crystal state is, for example, structured by at least one of polycrystal, microcrystal, and an amorphous part. The density of defect states of an amorphous part is higher than those of microcrystal.

In the first oxide film 431, the oxide semiconductor film 432, and the second oxide film 433, for example, c-axes are aligned, and a-axes and/or b-axes are not macroscopically aligned.

The first oxide film 431, the oxide semiconductor film 432, and the second oxide film 433 may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

The first oxide film 431, the oxide semiconductor film 432, and the second oxide film 433 may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that the first oxide film 431, the oxide semiconductor film 432, and the second oxide film 433 may be a mixed film including a microcrystalline oxide semiconductor and an amorphous oxide semiconductor. The mixed film, for example, includes a region of an amorphous oxide semiconductor and a region of a microcrystalline oxide semiconductor. Further, the mixed film may have a stacked structure including a region of an amorphous oxide semiconductor and a region of a microcrystalline oxide semiconductor, for example.

Note that the first oxide film 431, the oxide semiconductor film 432, and the second oxide film 433 may be in a single-crystal state, for example.

The thickness of the oxide semiconductor film 432 containing indium, gallium, and zinc as main components is determined in consideration of being the channel length. For example, the thickness of the oxide semiconductor film 432 can be 100 nm.

The first oxide film 431, the oxide semiconductor film 432, and the second oxide film 433 can be formed by a sputtering method, a molecular beam epitaxy (MBE) method, a chemical vapor deposition (CVD) method, a pulse laser deposition method, an atomic layer deposition (ALD) method, or the like as appropriate. The first oxide film 431, the oxide semiconductor film 432, and the second oxide film 433 may each be formed using a sputtering apparatus which performs deposition with surfaces of a plurality of substrates set substantially perpendicular to a surface of a sputtering target.

The first oxide film 431 and the second oxide film 433 can be formed by a sputtering method using a target including indium, gallium, zinc, and nitrogen as main components. Alternatively, the first oxide film 431 and the second oxide film 433 can be formed by performing a sputtering method using a target including indium, gallium, and zinc as main components under a nitrogen atmosphere. As the target, an amorphous target or a polycrystal target can be used.

Alternatively, the first oxide film 431 and the second oxide film 433 can be formed by forming an oxide film containing indium, gallium, and zinc as main components and introducing nitrogen into the oxide film.

As a method for introducing nitrogen, plasma treatment, an ion implantation method, an ion doping method, a plasma immersion ion implantation method, or the like can be used.

In the oxide film containing indium, gallium, zinc, and nitrogen as main components, which can be used as the first oxide film 431 and the second oxide film 433, nitrogen is preferably contained at greater than or equal to 3 atomic %.

Further, heat treatment may be performed on the first oxide film 431, the oxide semiconductor film 432, and the second oxide film 433 in order to remove excess hydrogen (including water or a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is put in an electric furnace which is one of heat treatment apparatuses, and the first oxide film 431, the oxide semiconductor film 432, and the second oxide film 433 are subjected to heat treatment at 450° C. for one hour in a nitrogen atmosphere.

The heat treatment apparatus is not limited to an electric furnace; any device for heating an object by heat conduction or heat radiation from a heating element such as a resistance heating element may be used. For example, a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the high-temperature gas, an inert gas which does not react with an object to be processed by heat treatment, such as nitrogen or a rare gas such as argon, is used.

For example, as the heat treatment, GRTA may be performed as follows: the substrate is put in an inert gas heated at a high temperature of 650° C. to 700° C., heated for several minutes, and taken out of the inert gas.

In the heat treatment, it is preferable that moisture, hydrogen, and the like be not contained in nitrogen or the rare gas such as helium, neon, or argon. The purity of nitrogen or the rare gas such as helium, neon, or argon which is introduced into the heat treatment apparatus is set to preferably 6N (99.9999%) or higher, more preferably 7N (99.99999%) or higher (that is, the impurity concentration is preferably 1 ppm or lower, more preferably 0.1 ppm or lower).

In addition, after the first oxide film 431, the oxide semiconductor film 432, and the second oxide film 433 are heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, more preferably less than or equal to 10 ppb according to the measurement with a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, more preferably 7N or higher (i.e., the impurity concentration in the oxygen gas or the dinitrogen monoxide gas is preferably 1 ppm or less, more preferably 0.1 ppm or less). The oxygen gas or the dinitrogen monoxide gas acts to supply oxygen that is a main constituent material of the oxide semiconductor and which is reduced by the step for removing impurities for dehydration or dehydrogenation, so that the oxide semiconductor film 432 can be highly purified.

Note that the heat treatment for dehydration or dehydrogenation may be performed at the time when the first oxide film 431, the oxide semiconductor film 432, and the second oxide film 433 are in film form or after being processed by etching. The heat treatment for dehydration or dehydrogenation may be performed plural times and may be combined with another heat treatment.

Further or alternatively, oxygen (which includes at least one of an oxygen radical, an oxygen atom, and an oxygen ion) may be introduced to the first oxide film 431, the oxide semiconductor film 432, and the second oxide film 433 after being subjected to the dehydration or dehydrogenation treatment to supply oxygen to the first oxide film 431, the oxide semiconductor film 432, and the second oxide film 433.

Introduction and supply of oxygen to the dehydrated or dehydrogenated oxide semiconductor film 432 achieves a highly purified and electrically i-type (intrinsic) oxide semiconductor film 432. The transistor including an electrically i-type (intrinsic) oxide semiconductor film 432, which is obtained by high purification, has smaller variation in the electric characteristics and is electrically stable.

Oxygen can be introduced by an ion implantation method, an ion doping method, a plasma immersion ion implantation method, plasma treatment, or the like.

The introduction of oxygen into the first oxide film 431, the oxide semiconductor film 432, and the second oxide film 433 is preferably performed after the dehydration or dehydrogenation treatment but not limited thereto. Further, oxygen may be introduced plural times into the first oxide film 431, the oxide semiconductor film 432, and the second oxide film 433 subjected to the dehydration or dehydrogenation treatment.

A resist mask 434 is formed over the first oxide film 431, the oxide semiconductor film 432, and the second oxide film 433. The first oxide film 431, the oxide semiconductor film 432, and the second oxide film 433 are etched by a dry etching method using the resist mask 434 and processed into a first oxide film 435, an oxide semiconductor film 436, and a second oxide film 437.

As a dry etching method, an inductively coupled plasma (ICP) etching method or the like can be used. For example, by an ICP etching method using a chlorine-based gas ($BCl_3:Cl_2$), the first oxide film 435, the oxide semiconductor film 436, and the second oxide film 437 can be formed.

Figure 4A:
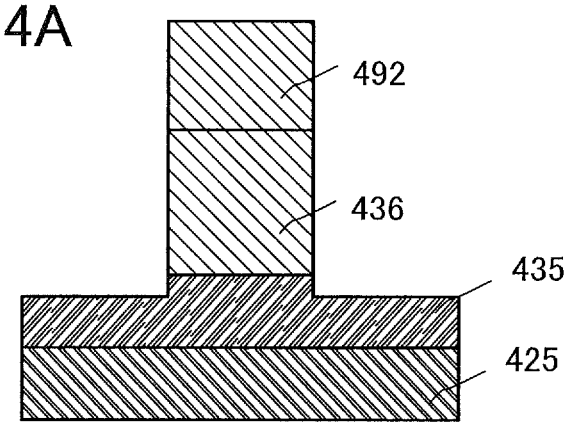
FIGS. 4A and 4B are cross-sectional views illustrating one embodiment of a method for manufacturing a semiconductor device.
Figure 4B:
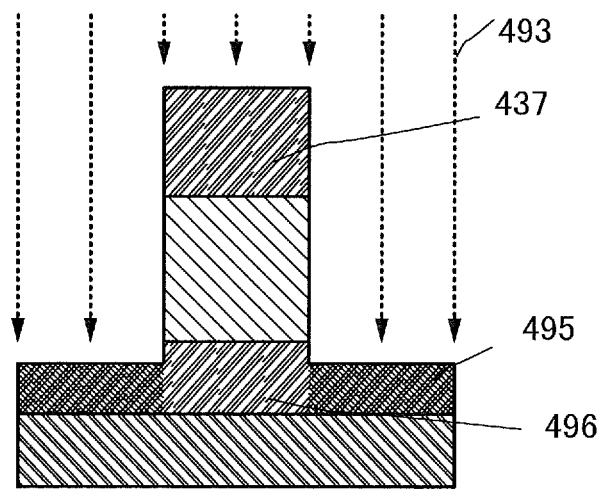
Figure 5A:
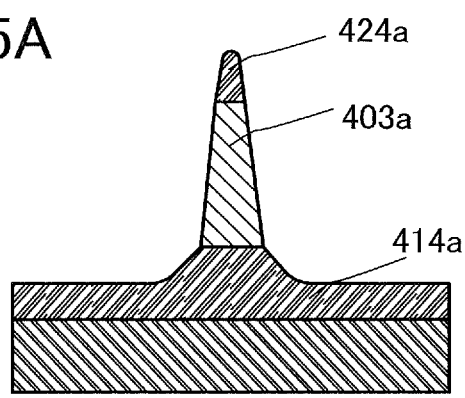
FIGS. 5A and 5B are cross-sectional views each illustrating a part of one embodiment of a semiconductor device.
Figure 5B:
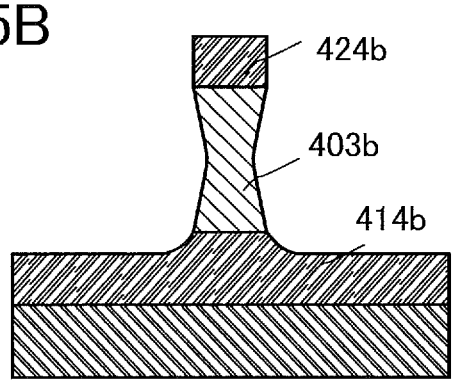

An example of forming the second oxide film by forming an oxide film containing indium, gallium, and zinc as main components and introducing nitrogen into the oxide film is illustrated in FIGS. 4A and 4B. As illustrated in FIG. 4A, an oxide film 492 containing indium, gallium, and zinc as main components is formed over a first oxide film 435 containing indium, gallium, zinc, and nitrogen as main components and an oxide semiconductor film 436 containing indium, gallium, and zinc as main components. Note that the oxide semiconductor film 436 has the same components as the oxide film 492; thus, these films may be a continuous film.

Next, as illustrated in FIG. 4B, nitrogen 493 is introduced into the oxide film 492, and a second oxide film 437 containing indium, gallium, zinc, and nitrogen as main components is formed. In FIG. 4B, nitrogen is introduced into part of the first oxide film 435 and a high nitrogen concentration region 495 and a low nitrogen concentration region 496 are formed in the first oxide film 435.

Note that in FIG. 4B, an example in which nitrogen is introduced into the whole of the oxide film 492 is shown; however, nitrogen may also be introduced into part of the oxide film 492, and nitrogen may be introduced into part of the oxide semiconductor film 436, in some cases, depending on the conditions of the introduction.

As a method for introducing nitrogen, plasma treatment, an ion implantation method, an ion doping method, a plasma immersion ion implantation method, or the like can be used.

Next, the oxide semiconductor film 436 containing indium, gallium, and zinc as main components is processed in an etching step using a wet etching method.

In the etching step of the oxide semiconductor film 436 containing indium, gallium, and zinc as main components, a mixed solution of acetic acid, nitric acid, and phosphoric acid is used and the second oxide film 437 containing indium, gallium, zinc, and nitrogen as main components, whose etching rate is lower than that of the oxide semiconductor film 436, is used as a mask to the mixed solution.

Figure 1C:
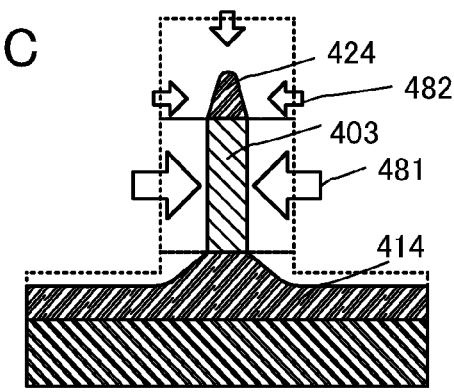
Figure 1D:
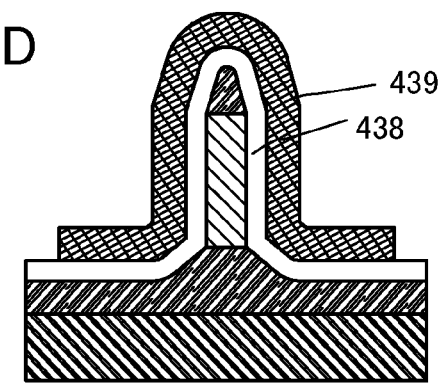

In FIG. 1C, arrows 481 visually indicate an etching rate of the oxide semiconductor film 436 and arrows 482 visually indicate an etching rate of the second oxide film 437. The arrows 481 indicating the etching rate of the oxide semiconductor film 436 which is higher are large and the arrows 482 indicating the etching rate of the second oxide film 437 which is lower are small.

The second oxide film 437 containing indium, gallium, zinc, and nitrogen as main components is etched using the mixed solution of acetic acid, nitric acid, and phosphoric acid. However, the etching rate of the second oxide film 437 is lower than that of the oxide semiconductor film 436 containing indium, gallium, and zinc as main components; therefore, the second oxide film 437 is not removed in the etching step and can be used as a mask which is gradually receded (reduced) in the width direction in the etching step. The mask is reduced in the width direction, whereby the oxide semiconductor film 436 containing indium, gallium, and zinc as main components is also etched in the width direction, so that the oxide semiconductor film 436 can be microfabricated into a columnar oxide semiconductor film 403 with a small width.

Note that the thickness of the second oxide film 437 is set so as not to be entirely removed by etching in the etching step of the oxide semiconductor film 436.

By using such the columnar object with a small width as the oxide semiconductor film 403, the transistor 410a can be miniaturized, so that a semiconductor device in which transistors are integrated with high density can be manufactured.

The second oxide film 424 containing indium, gallium, zinc, and nitrogen as main components, which is used as the mask after the etching, has lower resistance than the oxide semiconductor film 403 containing indium, gallium, and zinc as main components; thus, the second oxide film 424 can be used as a source region or a drain region without removal.

By providing the first oxide film 414 containing indium, gallium, zinc, and nitrogen as main components and the second oxide film 424 containing indium, gallium, zinc, and nitrogen as main components, which have low resistance and function as a source region and a drain region, with the oxide semiconductor film 403 including a channel formation region in the channel length direction provided between the first oxide film 414 and the second oxide film 424, the transistor 410a can achieve excellent on-state characteristics (e.g., high on-state current and high field-effect mobility), high-speed operation, and high-speed response.

Note that in the etching step, the first oxide film 435 is partly etched and becomes the first oxide film 414.

The shapes of the first oxide film 414, the oxide semiconductor film 403, and the second oxide film 424 can be slightly different from the above shapes depending on etching conditions (temperature, time, mixture conditions of the mixed solution, or the like). For example, as a first oxide film 414a, an oxide semiconductor film 403a, and a second oxide film 424a illustrated in FIG. 5A, the width of the oxide semiconductor film 403a may become narrow toward the second oxide film 424a in some cases. Further, as a first oxide film 414b, an oxide semiconductor film 403b, and a second oxide film 424b illustrated in FIG. 5B, the middle of the oxide semiconductor film 403b may be thin and the width may become thick toward the second oxide film 424b in some cases. In the case where an upper surface is a plane such as the second oxide film 424b not a projection, a contact area between the second oxide film 424b and the second electrode layer 425 becomes large; therefore, the second oxide film 424b is favorable for an electrical connection.

Next, a gate insulating film 438 is formed to cover the first oxide film 414, the oxide semiconductor film 403, and the second oxide film 424.

Further, plasma treatment may be performed on the oxide semiconductor film 403 before the gate insulating film 438 is formed. For example, plasma treatment using a rare gas (e.g., argon), a gas containing O (e.g., an $O_2$ gas, an $N_2O$ gas, a $CO_2$ gas, a CO gas, or an $NO_2$ gas), or the like can be performed.

The gate insulating film 438 has a thickness greater than or equal to 1 nm and less than or equal to 20 nm and can be formed by a sputtering method, an MBE method, a CVD method, a pulsed laser deposition method, an ALD method, or the like as appropriate. The gate insulating film 438 may be formed with a sputtering apparatus which performs deposition on surfaces of a plurality of substrates set substantially perpendicular to a surface of a sputtering target. Further, a metal organic chemical vapor deposition (MOCVD) method may be used. For example, a gallium oxide film deposited by an MOCVD method can be used as the gate insulating film 438.

The gate insulating film 438 can be formed using a silicon oxide film, a gallium oxide film, a gallium zinc oxide film, a zinc oxide film, an aluminum oxide film, a silicon nitride film, a silicon oxynitride film, an aluminum oxynitride film, or a silicon nitride oxide film. It is preferable that a portion of the gate insulating film 438 which is in contact with the oxide semiconductor film 403 contain oxygen. In particular, the gate insulating film 438 preferably contains an amount of oxygen which exceeds at least the amount of oxygen in the stoichiometric composition in the film (bulk). In this embodiment, a silicon oxynitride film formed by a CVD method is used as the gate insulating film 438. The use of the silicon oxynitride film containing a large amount of oxygen as the gate insulating film 438 makes it possible to supply oxygen to the oxide semiconductor film 403, which leads to favorable characteristics. Moreover, the gate insulating film 438 is preferably formed in consideration of the size of a transistor to be manufactured and the step coverage with the gate insulating film 438.

When the gate insulating film 438 is formed using a high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), hafnium aluminate ($HfAl_xO_y$ (x>0, y>0)), or lanthanum oxide, gate leakage current can be reduced. Further, the gate insulating film 438 may have either a single-layer structure or a stacked-layer structure.

Next, a conductive film is formed over the gate insulating film 438 by a sputtering method, an evaporation method, or the like and then etched, so that the island-shaped conductive film 439 is formed.

The island-shaped conductive film 439 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the conductive film 439. The conductive film 439 has either a single-layer structure or a stacked-layer structure.

The conductive film 439 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the conductive film 439 has a stacked structure of the above conductive material and the above metal material.

As a layer on the lowermost surface of the conductive film 439 which is in contact with the gate insulating film 438, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, an Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the transistor to be positive when used as the gate electrode layer, so that a normally-off switching element can be provided.

Anisotropic etching is performed on the conductive film 439, so that a first gate electrode layer 401*a* and a second gate electrode layer 401*b* are formed at the side of the oxide semiconductor film 403 in a self-aligned manner. The gate insulating film 438 is etched using the first gate electrode layer 401*a* and the second gate electrode layer 401*b* as masks, so that a first gate insulating film 402*a* and a second gate insulating film 402*b* are formed (see FIG. 2A). The first gate electrode layer 401*a* and the second gate electrode layer 401*b* face each other with the columnar oxide semiconductor film 403 sandwiched therebetween in such a manner that the first gate insulating film 402*a* is provided between the first gate electrode layer 401*a* and the oxide semiconductor film 403 and the second gate insulating film 402*b* is provided between the second gate electrode layer 401*b* and the oxide semiconductor film 403.

Figure 2A:
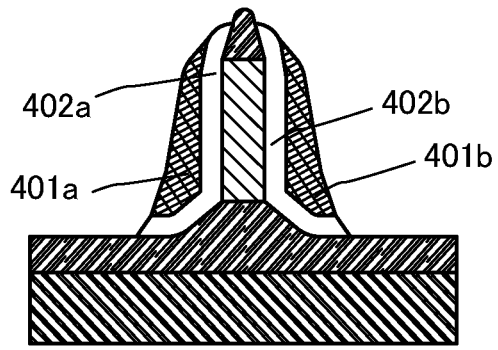
FIGS. 2A to 2D are cross-sectional views illustrating one embodiment of a semiconductor device and a method for manufacturing the semiconductor device.
Figure 2B:
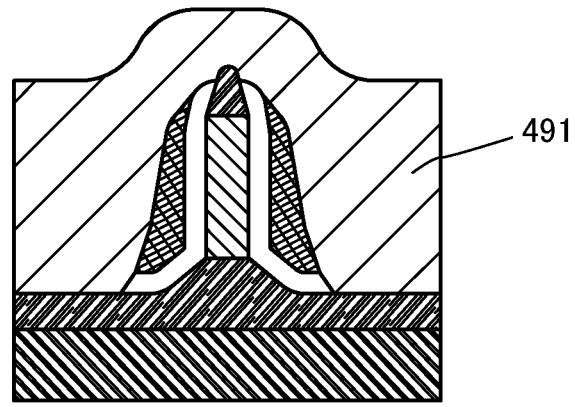

Next, an insulating film 491 is formed to cover the first electrode layer 415, the first oxide film 414, the oxide semiconductor film 403, the second oxide film 424, the first gate insulating film 402*a*, the second gate insulating film 402*b*, the first gate electrode layer 401*a*, and the second gate electrode layer 401*b* (see FIG. 2B).

As the insulating film 491, for example, an inorganic insulating film such as a silicon oxide film, a silicon oxynitride film, an aluminum oxide film, an aluminum oxynitride film, a silicon nitride film, an aluminum nitride film, a silicon nitride oxide film, an aluminum nitride oxide film, a gallium oxide film, a gallium zinc oxide film, or a zinc oxide film can be used. The inorganic insulating film may have a single-layer structure or a stacked-layer structure. The insulating film 491 can be formed by a plasma CVD method, a sputtering method, or a CVD method using a deposition gas.

The insulating film 491 is selectively removed by polishing treatment, so that the second oxide film 424 is exposed, and the second electrode layer 425 is formed in contact with the exposed second oxide film 424. Note that the insulating film 491 is planarized and becomes an interlayer insulating film 407. For the polishing treatment, for example, a chemical mechanical polishing (CMP) method can be used.

Figure 2C:
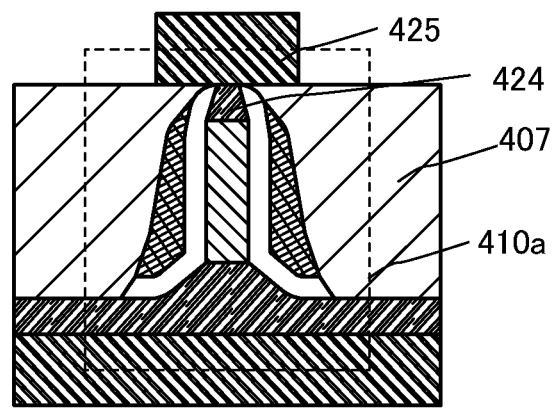

Note that by the polishing treatment for exposing the second oxide film 424, as illustrated in FIG. 2C, part of the second oxide film 424 may also be removed in some cases.

The second electrode layer 425 functioning as a source electrode layer or a drain electrode layer can be formed using a material and a method similar to those of the first electrode layer 415.

Through the above-described steps, the transistor 410*a* can be manufactured (see FIG. 2C).

Figure 2D:
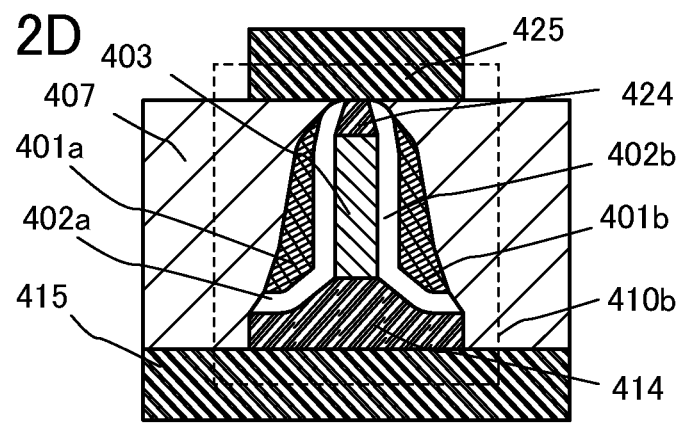

Further, the first oxide film 414 may be etched and processed into an island shape as illustrated in the transistor 410*b* in FIG. 2D. The etching process of the first oxide film 414 can be performed in the etching step in FIG. 1B.

Figure 3A:
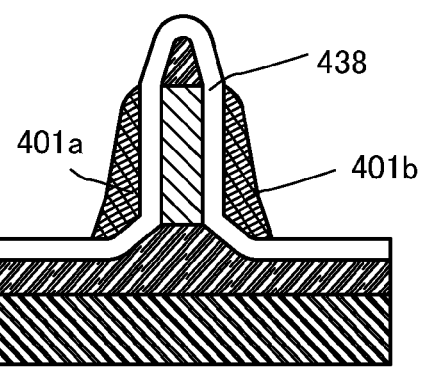
FIGS. 3A to 3D are cross-sectional views illustrating one embodiment of a semiconductor device and a method for manufacturing the semiconductor device.
Figure 3B:
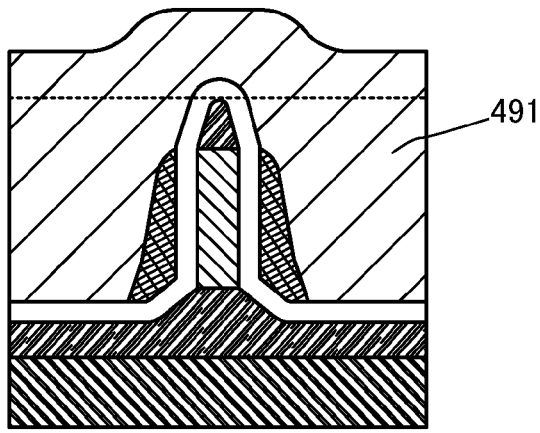
Figure 3C:
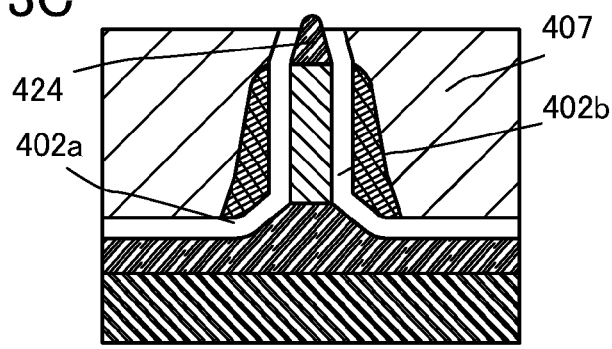

An example in which the formation method of the first gate insulating film 402*a* and the second gate insulating film 402*b* is different from that in the above-described example is shown in FIGS. 3A to 3C.

In FIG. 1C, as in FIG. 2A, after the gate insulating film 438 and the conductive film 439 are formed, the conductive film 439 is etched by an anisotropic etching method, whereby the first gate electrode layer 401*a* and the second gate electrode layer 401*b* are formed (see FIG. 3A). Note that at this time, an etching process is not performed on the gate insulating film 438 yet.

Next, the insulating film 491 is formed to cover the first electrode layer 415, the first oxide film 414, the oxide semiconductor film 403, the second oxide film 424, the gate insulating film 438, the first gate electrode layer 401*a*, and the second gate electrode layer 401*b* (see FIG. 3B).

In the step of selectively removing the insulating film 491 to expose the second oxide film 424, polishing treatment and etching treatment are performed. First, part of the insulating film 491 and the gate insulating film 438 over the second oxide film 424 which are located above a dotted line in FIG. 3B are removed by the polishing treatment. After that, dry etching treatment is performed under the condition for etching only the insulating film 491 and the gate insulating film 438, whereby the second oxide film 424 further protrudes (see FIG. 3C). Through the step, the gate insulating film 438 is processed into the first gate insulating film 402a and the second gate insulating film 402b.

Figure 3D:
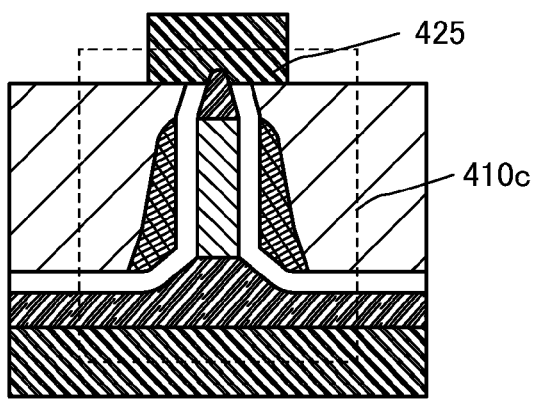

The second electrode layer 425 which is in contact with the exposed second oxide film 424 is formed and the transistor 410c can be manufactured (see FIG. 3D). The transistor 410c is different from the transistors 410a and 410b in that the first gate electrode layer 401a and the second gate electrode layer 401b are not used as masks in the manufacturing process of the first gate insulating film 402a and the second gate insulating film 402b; therefore, the first gate insulating film 402a and the second gate insulating film 402b are provided to extend from end portions of the first gate electrode layer 401a and the second gate electrode layer 401b.

As described in this embodiment, the first gate electrode layer 401a and the second gate electrode layer 401b are provided with the oxide semiconductor film 403 provided therebetween, whereby the transistors 410a, 410b, and 410c can be controlled by two gates. Accordingly, even in the microfabricated transistors 410a, 410b, and 410c, reduction in on-state current and an increase in off-leakage current can be suppressed.

Further, potentials of the two gates are controlled, whereby threshold voltage of the transistors 410a, 410b, and 410c can be controlled. For example, threshold voltage of the transistors 410a, 410b, and 410c can be more positive and thus, the transistors can serve as normally-off transistors.

As described above, miniaturized transistors 410a, 410b, and 410c having high and stable electric characteristics can be provided using high precision microfabrication with high yield.

Further, also in a semiconductor device including the transistors 410a, 410b, and 410c, high performance, high reliability, and high productivity can be achieved.

Embodiment 2

In this embodiment, an example of a semiconductor device using the transistor described in this specification is described with reference to FIG. 6 and FIGS. 7A and 7B.

Figure 6:
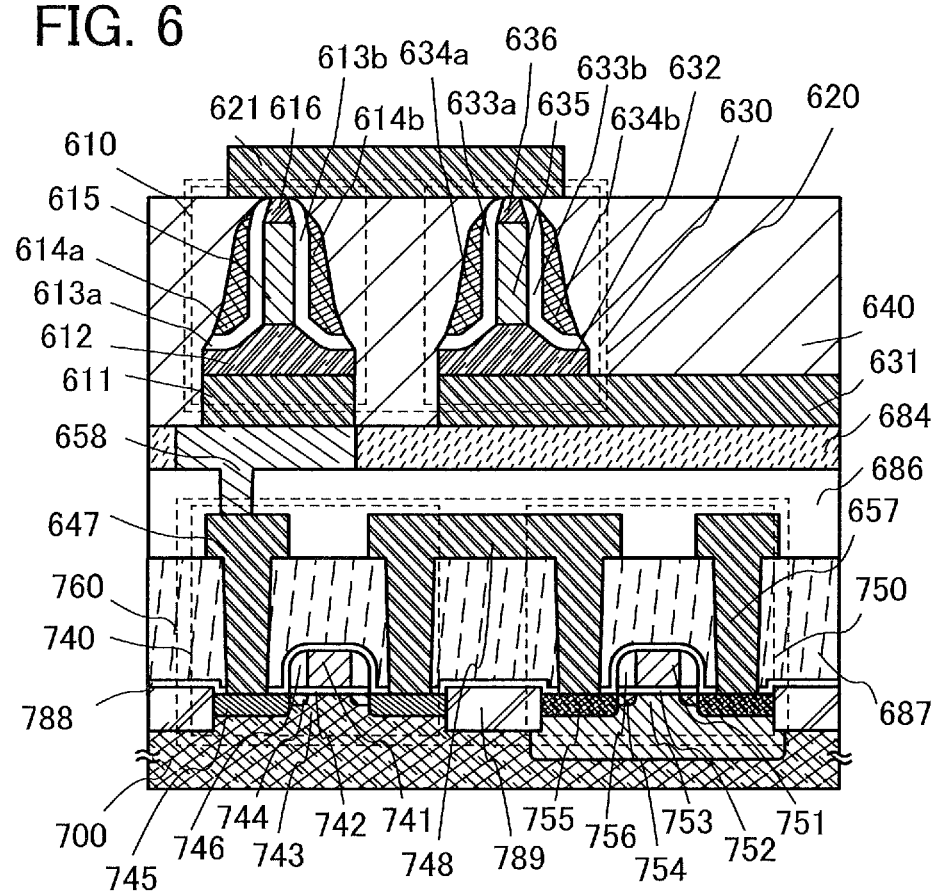
FIG. 6 is a cross-sectional view illustrating one embodiment of a semiconductor device.

The semiconductor device illustrated in FIG. 6 includes transistors 740 and 750 including a first semiconductor material in a lower portion, and transistors 610 and 630 including a second semiconductor material in an upper portion. The transistors 610 and 630 each have a structure similar to that of the transistors 410a, 410b, and 410c described in Embodiment 1.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a material such as silicon can easily operate at high speed. On the other hand, charge can be held in a transistor including an oxide semiconductor for a long time owing to its characteristics.

As a substrate which can be used in the semiconductor device, a single crystal semiconductor substrate or a poly-crystalline semiconductor substrate made of silicon or silicon carbide, a compound semiconductor substrate made of silicon germanium or the like, a silicon on insulator (SOI) substrate, or the like can be used. A channel formation region of the transistor can be formed in or over the substrate. The semiconductor device in FIG. 6 is an example in which the channel formation region is formed in the substrate to form a lower transistor.

In the semiconductor device in FIG. 6, a single crystal silicon substrate is used as a substrate 700, and the transistors 740 and 750 are formed using the single crystal silicon substrate. Single crystal silicon is used as the first semiconductor material. The transistor 740 is an n-channel transistor and the transistor 750 is a p-channel transistor. The transistor 740 and the transistor 750 which are electrically connected to each other form a complementary metal oxide semiconductor (CMOS) circuit 760.

In this embodiment, the single crystal silicon substrate imparting p-type conductivity is used as the substrate 700; thus, an n-well is formed by adding an impurity element imparting n-type conductivity to a region in which the p-channel transistor 750 is to be formed. A channel formation region 753 of the transistor 750 is formed in the n-well. As the impurity element imparting n-type conductivity, phosphorus (P), arsenic (As), or the like can be used.

Therefore, an impurity element imparting p-type conductivity is not added to a region in which the n-channel transistor 740 is to be formed; however, a p-well may be formed by adding an impurity element imparting p-type conductivity. As the impurity element imparting p-type conductivity, boron (B), aluminum (Al), gallium (Ga), or the like may be used.

Meanwhile, when a single-crystal silicon substrate imparting n-type conductivity is used, an impurity element imparting p-type conductivity may be added to form a p-well.

The transistor 740 includes a channel formation region 743, an n-type impurity region 744 functioning as a lightly doped drain (LDD) region, an n-type impurity region 745 functioning as a source region or a drain region, a gate insulating film 742, and a gate electrode layer 741. A side of the gate electrode layer 741 is provided with a sidewall insulating layer 746. With the use of the gate electrode layer 741 and the sidewall insulating layer 746 as masks, the n-type impurity region 744 and the n-type impurity region 745 which have different impurity concentrations can be formed in a self-aligned manner.

The transistor 750 includes the channel formation region 753, a p-type impurity region 754 functioning as an LDD region, a p-type impurity region 755 functioning as a source region or a drain region, a gate insulating film 752, and a gate electrode layer 751. A side of the gate electrode layer 751 is provided with a sidewall insulating layer 756. With the use of the gate electrode layer 751 and the sidewall insulating layer 756 as masks, the p-type impurity region 754 and the p-type impurity region 755 which have different impurity concentrations can be formed in a self-aligned manner.

In the substrate 700, the transistor 740 and the transistor 750 are isolated from each other by an element isolation region 789. An insulating film 788 and an insulating film 687 are stacked over the transistor 740 and the transistor 750. In openings formed in the insulating films 788 and 687, a wiring layer 647 in contact with the n-type impurity region 745, a wiring layer 657 in contact with the p-type impurity region 755, and a wiring layer 748 which is in contact with the n-type impurity region 745 and the p-type impurity region 755 and electrically connects the transistors 740 and 750 in the source region and the drain region are formed.

An insulating film 686 is provided over the insulating film 687, the wiring layer 647, the wiring layer 748, and the wiring layer 657. A wiring layer 658 which is in contact with and electrically connected to the wiring layer 647 is formed over the insulating film 686 and in an opening formed in the insulating film 686. The wiring layer 658 is provided to be embedded in the insulating film 684 provided over the insulating film 686 so as to expose only the upper surface of the wiring layer 658.

However, the semiconductor device of this embodiment is not limited to this; a semiconductor film including an island-shaped channel formation region over a substrate may be formed to manufacture a transistor in the lower portion. In this case, an SOI substrate may be used or a semiconductor film may be formed over the substrate by a deposition method and processed into an island shape. Alternatively, a semiconductor film provided on another manufacturing substrate may be transferred to the substrate to form the semiconductor film over the substrate.

As the transistors 740 and 750, a transistor containing silicide (salicide) or a transistor which does not include a sidewall insulating layer may be used. When a structure that contains silicide (salicide) is used, resistance of the source region and the drain region can be further lowered and the speed of the semiconductor device is increased. Further, the semiconductor device can be operated at low voltage; thus, power consumption of the semiconductor device can be reduced.

Next, an element structure in the upper portion provided over the transistor in the lower portion of the semiconductor device in FIG. 6 is described.

Further, in the semiconductor device, an insulating film functioning as a barrier film is preferably provided between the lower portion and the upper portion (e.g., between the insulating film 686 and the insulating film 684) to prevent impurities such as hydrogen, which cause deterioration or a change in electric characteristics of the transistor 610 in the upper portion, from entering the upper portion from the lower portion. For example, a fine organic insulating film (e.g., an aluminum oxide film or a silicon nitride film) having a high blocking property of the impurities or the like is preferably used as a barrier film.

The transistors 610 and 630 can be manufactured by the same method as that of the transistors 410a, 410b, or 410c.

The transistor 610 is a vertical transistor in which a first electrode layer 611, a first oxide film 612 containing indium, gallium, zinc, and nitrogen as main components, an oxide semiconductor film 615 containing indium, gallium, and zinc as main components, a second oxide film 616 containing indium, gallium, zinc, and nitrogen as main components, and a second electrode layer 621 are stacked in this order, a first gate insulating film 613a and a first gate electrode layer 614a are provided at one side of the columnar oxide semiconductor film 615, and a second gate insulating film 613b and a second gate electrode layer 614b are provided at the other side of the columnar oxide semiconductor film 615.

In the transistor 610, the first electrode layer 611 and the second electrode layer 621 function as a source electrode layer and a drain electrode layer, and the first oxide film 612 and the second oxide film 616 are low-resistance regions having lower resistance than the oxide semiconductor film 615 and function as a source region and a drain region.

The first gate electrode layer 614a and the second gate electrode layer 614b face each other with the columnar oxide semiconductor film 615 sandwiched therebetween in such a manner that the first gate insulating film 613a is provided between the first gate electrode layer 614a and the oxide semiconductor film 615 and the second gate insulating film 613b is provided between the second gate electrode layer 614b and the oxide semiconductor film 615. Note that the first gate insulating film 613a and the second gate insulating film 613b may be a continuous film. Further, in the case where the first gate electrode layer 614a and the second gate electrode layer 614b are always controlled by the same potentials, the first gate electrode layer 614a and the second gate electrode layer 614b may be a continuous film.

Similarly, the transistor 630 is a vertical transistor in which a first electrode layer 631, a first oxide film 632 containing indium, gallium, zinc, and nitrogen as main components, an oxide semiconductor film 635 containing indium, gallium, and zinc as main components, a second oxide film 636 containing indium, gallium, zinc, and nitrogen as main components, and the second electrode layer 621 are stacked in this order, and a first gate insulating film 633a, a first gate electrode layer 634a are provided at one side of the columnar oxide semiconductor film 635, and a second gate insulating film 633b and a second gate electrode layer 634b are provided at the other side of the columnar oxide semiconductor film 635.

In the transistor 630, the first electrode layer 631 and the second electrode layer 621 function as a source electrode layer and a drain electrode layer, and the first oxide film 632 and the second oxide film 636 are low-resistance regions having lower resistance than the oxide semiconductor film 635 and function as a source region and a drain region.

The first gate electrode layer 634a and the second gate electrode layer 634b face each other with the columnar oxide semiconductor film 635 sandwiched therebetween in such a manner that the first gate insulating film 633a is provided between the first gate electrode layer 634a and the oxide semiconductor film 635 and the second gate insulating film 633b is provided between the second gate electrode layer 634b and the oxide semiconductor film 635. Note that the first gate insulating film 633a and the second gate insulating film 633b may be a continuous film. Further, in the case where the first gate electrode layer 634a and the second gate electrode layer 634b are always controlled by the same potential, the first gate electrode layer 634a and the second gate electrode layer 634b may be a continuous film.

In this embodiment, the transistors 610 and 630 are n-channel transistors, and electrically connected to each other through the common second electrode layer 621, so that an NMOS circuit 620 is formed.

The first electrode layer 611 of the transistor 610 is provided in contact with the wiring layer 658 electrically connected to the transistor 740, whereby the CMOS circuit 760 in the lower portion and the NMOS circuit 620 in the upper portion are electrically connected to each other.

In the etching step of the oxide semiconductor film containing indium, gallium, and zinc as main components of the transistors 610 and 630, a mixed solution of acetic acid, nitric acid, and phosphoric acid is used and the second oxide film containing indium, gallium, zinc, and nitrogen as main components, whose etching rate is lower than that of the oxide semiconductor film, is used as a mask to the mixed solution.

The second oxide film containing indium, gallium, zinc, and nitrogen as main components is etched using the mixed solution of acetic acid, nitric acid, and phosphoric acid. However, the etching rate of the second oxide film is lower than that of the oxide semiconductor film containing indium, gallium, and zinc as main components; therefore, the second oxide film can be used as a mask which is gradually receded (reduced) in the width direction in the etching step. The mask is reduced in the width direction, whereby the oxide semiconductor film containing indium, gallium, and zinc as main components is also etched in the width direction, so that the oxide semiconductor film can be microfabricated into a columnar shape with a small width. By using such the columnar oxide semiconductor films 615 and 635 with a small width, the transistors 610 and 630 can be miniaturized, so that a semiconductor device in which transistors are integrated with high density can be manufactured.

The second oxide film 616 containing indium, gallium, zinc, and nitrogen as main components, which is used as the mask, has lower resistance than the oxide semiconductor film containing indium, gallium, and zinc as main components; thus, the second oxide film 616 can be used as a source region or a drain region without removal.

Further, the first gate electrode layers 614*a* and 634*a* and the second gate electrode layers 614*b* and 634*b* are provided with the oxide semiconductor films 615 and 635 provided therebetween, respectively, whereby the transistors 610 and 630 can be controlled by two gates. Accordingly, even in the microfabricated transistors 610 and 630, reduction in on-state current and an increase in off-leakage current can be suppressed.

Further, potentials of the two gates are controlled, whereby threshold voltage of the transistors 610 and 630 can be controlled. For example, threshold voltage of the transistors 610 and 630 can be more positive and thus, the transistors can serve as normally-off transistors.

Figure 7A:
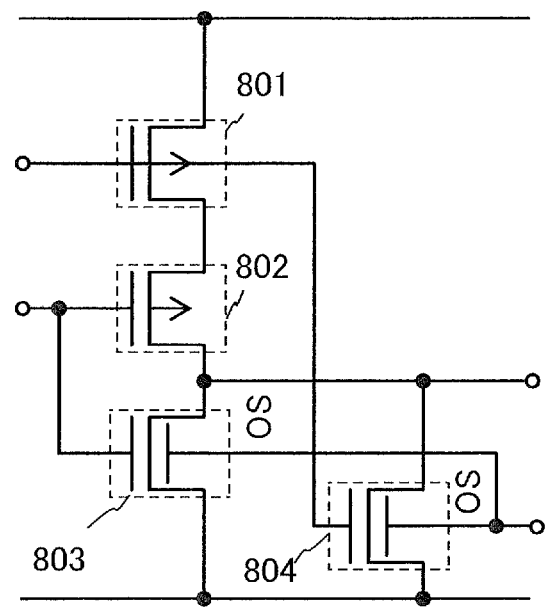
FIGS. 7A and 7B are circuit diagrams each illustrating one embodiment of a semiconductor device.
Figure 7B:
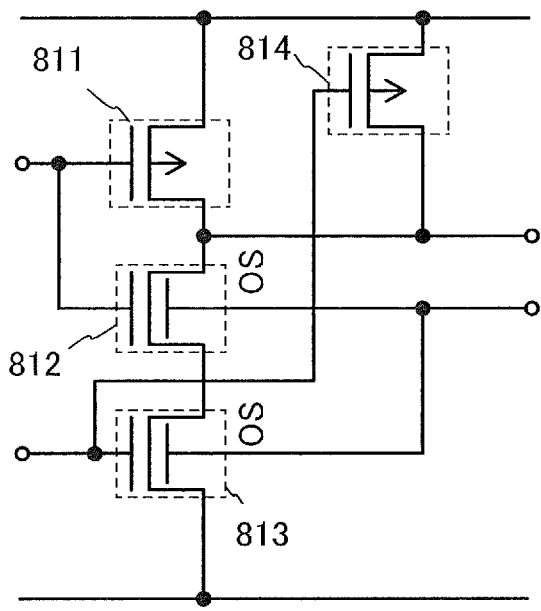

As other examples of the semiconductor device using the transistor described in this specification, a NOR circuit and a NAND circuit which are logic circuits are illustrated in FIGS. 7A and 7B. FIG. 7A is the NOR circuit and FIG. 7B is the NAND circuit.

In the NOR circuit and the NAND circuit illustrated in FIGS. 7A and 7B, each of a transistor 801, the transistor 802, a transistor 811, and a transistor 814 that are p-channel transistors is a transistor which has the same structure as the transistor 750 illustrated in FIG. 6 and in which a single crystal silicon substrate is used for a channel formation region. Each of the transistor 803, a transistor 804, a transistor 812, and a transistor 813 that are n-channel transistors is a transistor which has the same structure as the transistors 610 and 630 illustrated in FIG. 6 or the transistors 410*a*, 410*b*, and 410*c* described in Embodiment 1 and in which an oxide semiconductor film can be used for a channel formation region.

Therefore, the transistors 803, 804, 812, and 813 have the same structure as the transistors 610 and 630 and thus have the same effect as the transistors 610 and 630.

In the semiconductor device in this embodiment, the transistor in which an oxide semiconductor is used for the channel formation region and which has extremely small off-state current is employed; therefore, power consumption can be sufficiently reduced.

Further, with a stack of semiconductor elements using different semiconductor materials, a miniaturized and highly integrated semiconductor device with stable electrical characteristics and a method for manufacturing the semiconductor device can be provided.

The structures, methods, and the like described in this embodiment can be combined as appropriate with any of the other structures, methods, and the like described in the other embodiments.

Embodiment 3

In this embodiment, an example of a semiconductor device (memory device) which includes the transistor described in this specification, which can hold stored data even when not powered, and which has an unlimited number of write cycles is described with reference to drawings.

Figure 8:
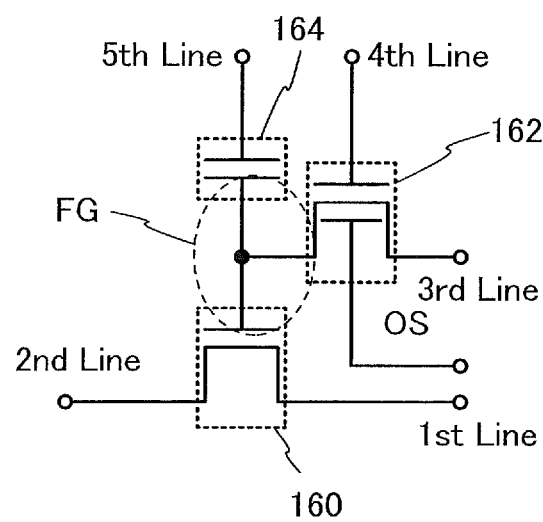
FIG. 8 is a circuit diagram illustrating one embodiment of a semiconductor device.

FIG. 8 is a circuit diagram illustrating a semiconductor device of this embodiment.

The semiconductor device illustrated in FIG. 8 includes a transistor 160 to which a structure similar to that of the transistor 750 described in Embodiment 2 can be applied and a transistor 162 to which a structure similar to that of the transistors 410*a*, 410*b*, and 410*c* described in Embodiment 1 can be applied.

Here, the transistor 160 to which a structure similar to that of the transistor 750 using a silicon semiconductor or the like is applied can easily operate at high speed. Further, charge can be held in the transistor 162 to which a structure similar to that of the transistors 410*a*, 410*b*, and 410*c* using an oxide semiconductor described in Embodiment 1 can be applied for a long time owing to its characteristics.

Although all the transistors are n-channel transistors here, it is needless to say that p-channel transistors can be used.

In FIG. 8, a first wiring (1st Line) is electrically connected to a source electrode layer of the transistor 160. A second wiring (2nd Line) is electrically connected to a drain electrode layer of the transistor 160. A third line (3rd Line) is electrically connected to one of a source electrode layer and a drain electrode layer of the transistor 162. A fourth line (4th Line) is electrically connected to a gate electrode layer of the transistor 162. The gate electrode layer of the transistor 160 and the other of the source electrode layer and the drain electrode layer of the transistor 162 are electrically connected to one electrode of the capacitor 164. A fifth wiring (5th line) is electrically connected to the other electrode of the capacitor 164.

The semiconductor device in FIG. 8 utilizes a feature in which the potential of the gate electrode layer of the transistor 160 can be held, and thus enables writing, holding, and reading of data as follows.

Description is given of writing and holding of data. First, the potential of the fourth line is set to a potential at which the transistor 162 is turned on, so that the transistor 162 is turned on. Accordingly, the potential of the third wiring is supplied to the gate electrode layer of the transistor 160 and to the capacitor 164. That is, predetermined charge is supplied to the gate electrode layer of the transistor 160 (writing). Here, charge for supplying either of two different potential levels (hereinafter referred to as low-level charge and high-level charge) is given. Then, the potential of the fourth wiring is set to a potential at which the transistor 162 is turned off, so that the transistor 162 is turned off. Thus, the charge given to the gate electrode layer of the transistor 160 is held (holding).

Since the off-state current of the transistor 162 is extremely small, the charge of the gate electrode layer of the transistor 160 is held for a long time.

Next, description is given of reading of data. By supplying an appropriate potential (a reading potential) to the fifth wiring while supplying a predetermined potential (a constant potential) to the first wiring, the potential of the second wiring varies depending on the amount of charge held at the gate electrode layer of the transistor 160. This is because in general, when the transistor 160 is an n-channel transistor, an apparent threshold voltage $V_{th\_H}$ at the time when the high-level potential is given to the gate electrode layer of the transistor 160 is lower than an apparent threshold voltage $V_{th\_L}$ at the time when the low-level charge is given to the gate electrode layer of the transistor 160. Here, the apparent threshold voltage refers to the potential of the fifth line, which is needed to turn on the transistor 160. Thus, the potential of the fifth wiring is set to a potential $V_0$ which is between $V_{th\_H}$ and $V_{th\_L}$, whereby charge supplied to the gate electrode layer of the transistor 160 can be determined. For example, in the case where a high-level charge is given in writing, when the potential of the fifth wiring is set to $V_0$ ($>V_{th\_H}$), the transistor 160 is turned on. In the case where a low-level charge is given in writing, even when the potential of the fifth wiring is set to $V_0$ ($<V_{th\_L}$), the transistor 160 remains in an off state. Therefore, the stored data can be read by the potential of the second line.

Note that in the case where memory cells are arrayed to be used, only data of desired memory cells needs to be read. In the case where such reading is not performed, a potential at which the transistor 160 is turned off regardless of the state of the gate electrode layer, that is, a potential smaller than $V_{th\_H}$ may be given to the fifth wiring. Alternatively, a potential at which the transistor 160 is turned on regardless of the state of the gate electrode layer, that is, a potential higher than $V_{th\_L}$ may be given to the fifth line.

FIG. 9 illustrates an example of one embodiment of a structure of a memory device different from the above-described memory device.

FIG. 9 is a perspective view of a memory device. The memory device illustrated in FIG. 9 includes a plurality of layers of memory cell arrays (memory cell arrays 3400(1) to 3400(*n*) (n is an integer greater than or equal to 2)) each including a plurality of memory cells as memory circuits in an upper portion, and a logic circuit 3004 in a lower portion which is necessary for operating the memory cell arrays 3400(1) to 3400(*n*).

FIG. 9 illustrates the logic circuit 3004, the memory cell array 3400(1), and the memory cell array 3400(2), and illustrates a memory cell 3170*a* and a memory cell 3170*b* as typical examples among the plurality of memory cells included in the memory cell array 3400(1) and the memory cell array 3400(2). The memory cell 3170*a* and the memory cell 3170*b* can have a configuration similar to the circuit configuration described in this embodiment and illustrated in FIG. 8, for example.

Note that as transistors included in the memory cells 3170*a* and 3170*b*, a transistor in which a channel formation region is formed in an oxide semiconductor film is used. The structure of the transistor in which the channel formation region is formed in the oxide semiconductor film is the same as the structure described in Embodiment 1, and thus the description of the structure is omitted.

The logic circuit 3004 includes a transistor in which a semiconductor material other than an oxide semiconductor is used for a channel formation region. For example, a transistor obtained by providing an element isolation insulating layer on a substrate containing a semiconductor material (e.g., silicon) and forming a region serving as the channel formation region in a region surrounded by the element isolation insulating layer can be used. Note that the transistor may be a transistor obtained in such a manner that the channel formation region is formed in a semiconductor film such as a polycrystalline silicon film formed on an insulating surface or in a silicon film of an SOI substrate.

The memory cell arrays 3400(1) to 3400(*n*) and the logic circuit 3004 are stacked with interlayer insulating layers provided therebetween, and are electrically connected to each other as appropriate through electrodes and wirings which penetrate the interlayer insulating layers, for example.

By applying a transistor in which an oxide semiconductor is used for a channel formation region and which has extremely small off-state current to the semiconductor device in this embodiment, the semiconductor device can store data for an extremely long time. That is, refresh operation is unnecessary or the frequency of refresh operation is extremely low, leading to a sufficient reduction in power consumption. Further, stored data can be held for a long time even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the semiconductor device of one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly integrated semiconductor device having high electrical characteristics and a method for manufacturing the semiconductor device can be provided.

The structures, methods, and the like described in this embodiment can be combined as appropriate with any of the other structures, methods, and the like described in the other embodiments.

Embodiment 4

In this embodiment, a central processing unit (CPU) at least part of which includes the transistor disclosed in Embodiment 1 is described as an example of a semiconductor device.

Figure 10A:
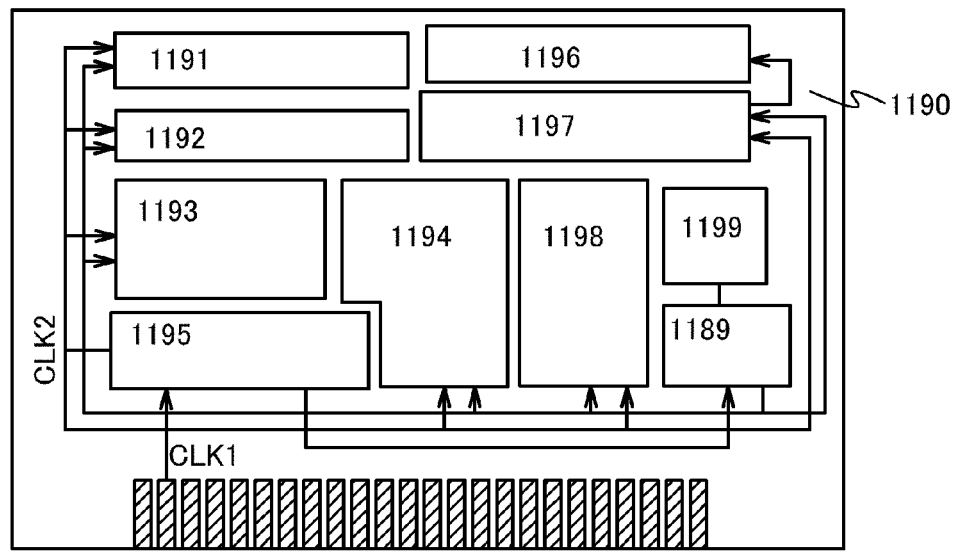
FIGS. 10A to 10C are block diagrams illustrating one embodiment of a semiconductor device.

FIG. 10A is a block diagram illustrating a specific structure of a CPU. The CPU illustrated in FIG. 10A includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189. A semiconductor substrate, an SOI substrate, a glass substrate, or the like is used as the substrate 1190. The rewritable ROM 1199 and the ROM interface 1189 may each be provided over a separate chip. Obviously, the CPU illustrated in FIG. 10A is only an example in which the configuration is simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls on the basis of the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller

1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 10A, a memory cell is provided in the register 1196. The memory cell disclosed in Embodiment 3 can be used as the memory cell in the register 1196.

In the CPU illustrated in FIG. 10A, the register controller 1197 selects operation of holding data in the register 1196 in accordance with an instruction from the ALU 1191. That is, the register controller 1197 selects whether data is held by a logic element which inverts logic (a logical value) or a capacitor in the memory cell included in the register 1196. When data holding by the logic element which inverts logic (a logical value) is selected, power supply voltage is supplied to the memory cell in the register 1196. When data holding by the capacitor is selected, the data is rewritten in the capacitor, and supply of power supply voltage to the memory cell in the register 1196 can be stopped.

Figure 10B:
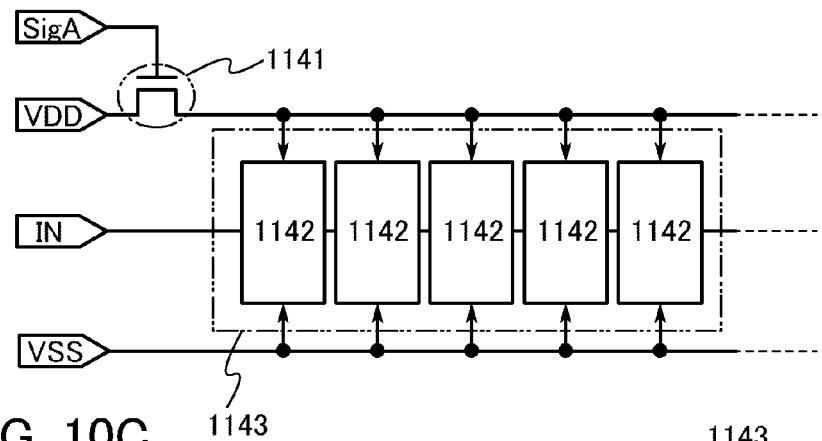
Figure 10C:
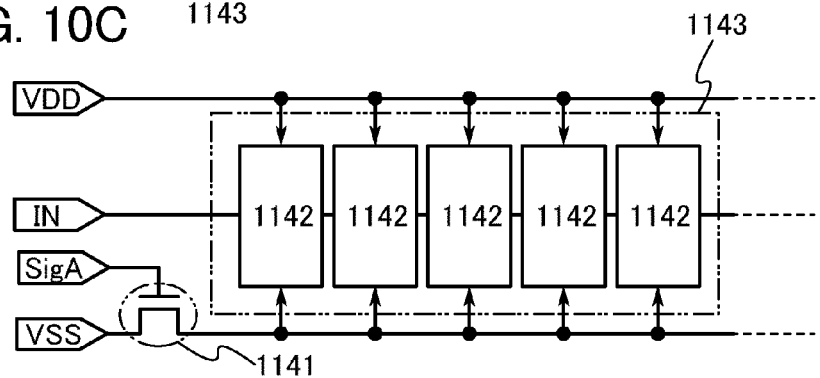

The power supply can be stopped by providing a switching element between a memory cell group and a node to which a power supply potential VDD or a power supply potential VSS is supplied, as illustrated in FIG. 10B or FIG. 10C. Circuits illustrated in FIGS. 10B and 10C are described below.

FIGS. 10B and 10C each illustrate an example of a structure of a memory circuit in which the transistor disclosed in Embodiment 1 is used as a switching element for controlling supply of a power supply potential to a memory cell.

The memory device illustrated in FIG. 10B includes a switching element 1141 and a memory cell group 1143 including a plurality of memory cells 1142. Specifically, as each of the memory cells 1142, the memory cell described in Embodiment 3 can be used. Each of the memory cells 1142 included in the memory cell group 1143 is supplied with the high-level power supply potential VDD through the switching element 1141. Further, each of the memory cells 1142 included in the memory cell group 1143 is supplied with a potential of a signal IN and the low-level power supply potential VSS.

In FIG. 10B, the transistor described in Embodiment 1 is used as the switching element 1141, and the switching of the transistor is controlled by a signal SigA supplied to a gate electrode layer thereof.

Note that FIG. 10B illustrates the configuration in which the switching element 1141 includes only one transistor; however, one embodiment of the present invention is not limited thereto, and the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 10B, the switching element 1141 may control the supply of the low-level power supply potential VSS.

In FIG. 10C, an example of a memory device in which each of the memory cells 1142 included in the memory cell group 1143 is supplied with the low-level power supply potential VSS through the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The structures, methods, and the like described in this embodiment can be combined as appropriate with any of the other structures, methods, and the like described in the other embodiments.

Embodiment 5

A semiconductor device disclosed in this specification can be applied to a variety of electronic appliances (including game machines). Examples of the electronic appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, medical equipment such as dialyzers, and the like. Further, the examples include industrial equipment such as guide lights, traffic lights, belt conveyors, elevators, escalators, industrial robots, and power storage systems. In addition, oil engines, moving objects driven by electric motors using power from non-aqueous secondary batteries, and the like are also included in the category of the electric appliances. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic appliances are illustrated in FIGS. 11A to 11C, FIGS. 12A and 12*b*, and FIGS. 13A to 13C.

Figure 11A:
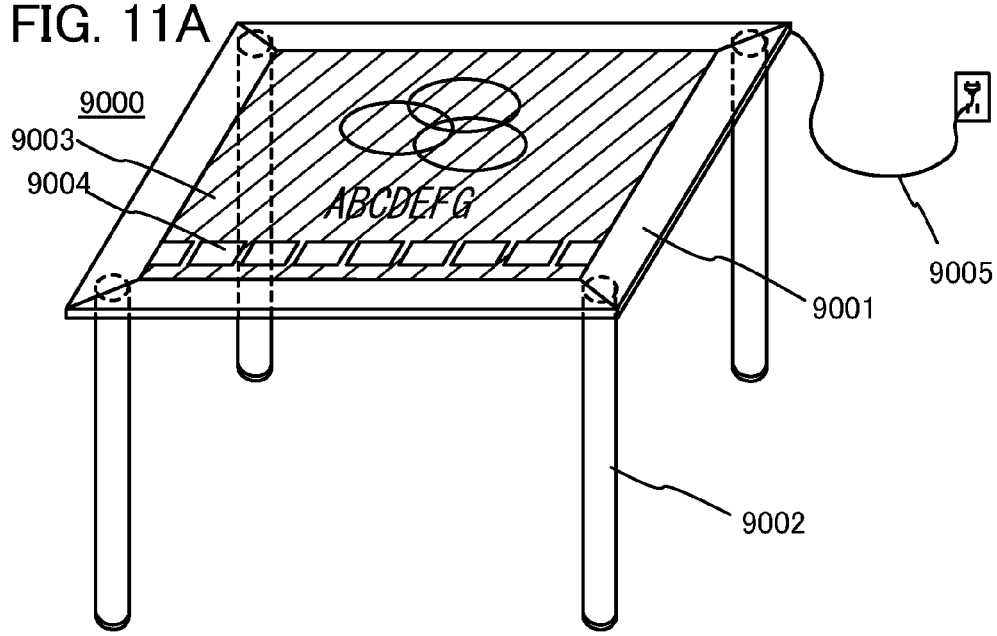
FIGS. 11A to 11C each illustrate an electronic device.

FIG. 11A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

The transistor described in Embodiment 1 can be used in the display portion 9003 so that the electronic device can have high reliability.

The display portion 9003 has a touch-input function. When a user touches displayed buttons 9004 which are displayed on the display portion 9003 of the table 9000 with his/her finger or the like, the user can carry out operation of a screen and input of information. Further, when the table may be made to communicate with home appliances or control the home appliances, the table 9000 may function as a control device which controls the home appliances by operation on the screen. For example, with the use of a semiconductor device having an image sensor function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

Figure 11B:
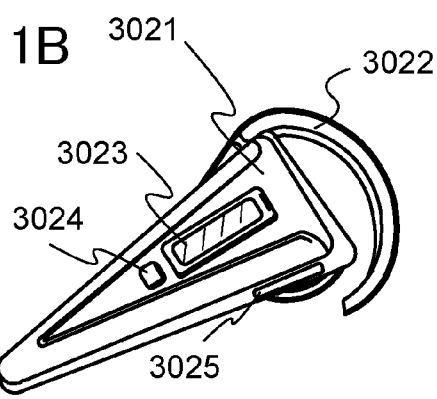

FIG. 11B illustrates a portable music player, which includes, in a main body 3021, a display portion 3023, a fixing portion 3022 with which the main body is worn on the ear, a speaker, an operation button 3024, an external memory slot 3025, and the like. The transistor, the memory, or the integrated circuit which are described in any of Embodiments 1 to 4 is used in a memory or a CPU incorporated in the main body 3021, whereby a portable music player (PDA) in which power consumption can be further reduced can be provided.

Further, when the portable music player illustrated in FIG. 11B has an antenna, a microphone function, or a wireless communication function and is used with a mobile phone, a user can talk on the phone wirelessly in a hands-free way while driving a car or the like.

Figure 11C:
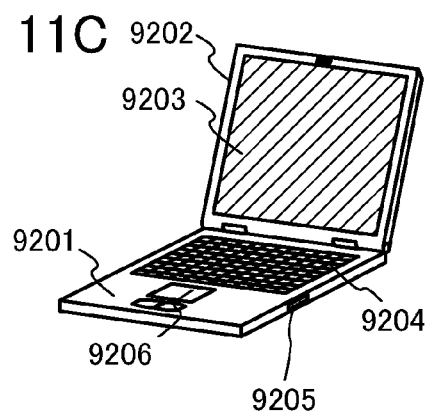

FIG. 11C illustrates a computer which includes a main body 9201 including a CPU, a housing 9202, a display portion 9203, a keyboard 9204, an external connection port 9205, a pointing device 9206, and the like. The computer includes a semiconductor device manufactured with the use of one embodiment of the present invention for the display portion 9203. With the use of the CPU described in Embodiment 4, power consumption of the computer can be reduced.

Figure 12A:
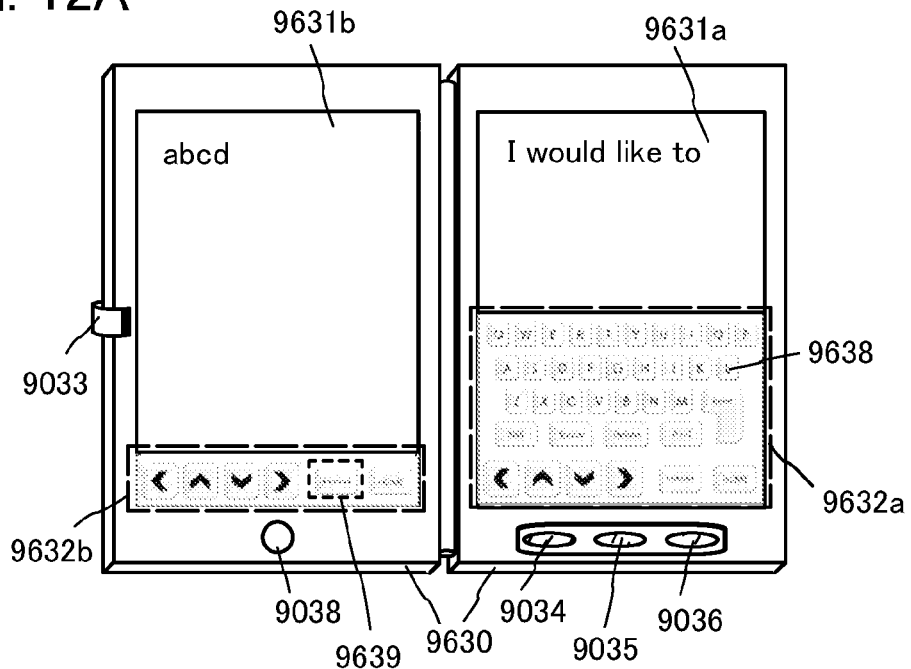
FIGS. 12A to 12C illustrate an electronic device.
Figure 12B:
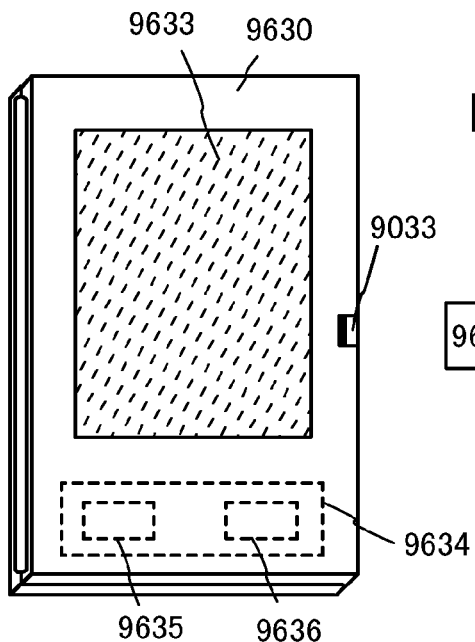

FIGS. 12A and 12B illustrate a tablet terminal that can be folded. In FIG. 12A, the tablet terminal is opened, and includes a housing 9630, a display portion 9631a, a display portion 9631b, a switch 9034 for switching display modes, a power switch 9035, a switch 9036 for switching to power-saving mode, a fastener 9033, and an operation switch 9038.

In such a portable device illustrated in FIGS. 12A and 12B, an SRAM or a DRAM is used as a memory for temporarily storing image data. For example, the semiconductor device described in Embodiment 3 can be used as the memory. The semiconductor device described in the above embodiment employed for the memory element enables writing and reading of data to be performed at high speed, enables data to be stored for a long time, and enables power consumption to be sufficiently reduced.

A touch panel area 9632a can be provided in a part of the display portion 9631a, in which data can be input by touching displayed operation keys 9638. Note that FIG. 12A illustrates, as an example, that half of the area of the display portion 9631a has only a display function and the other half of the area has a touch panel function. However, the structure of the display portion 9631a is not limited to this, and all the area of the display portion 9631a may have a touch panel function. For example, all the area of the display portion 9631a can display keyboard buttons and serve as a touch panel while the display portion 9631b can be used as a display screen.

Like the display portion 9631a, part of the display portion 9631b can be a touch panel region 9632b. When a finger, a stylus, or the like touches the place where a button 9639 for switching to keyboard display is displayed in the touch panel, keyboard buttons can be displayed on the display portion 9631b.

Touch input can be performed concurrently on the touch panel regions 9632a and 9632b.

The switch 9034 for switching display modes allows switching between a landscape mode and a portrait mode, color display and black-and-white display, and the like. With the switch 9036 for switching to power-saving mode, the luminance of display can be optimized depending on the amount of external light at the time when the tablet is in use, which is detected with an optical sensor incorporated in the tablet. The tablet may include another detection device such as a sensor for detecting orientation (e.g., a gyroscope or an acceleration sensor) in addition to the optical sensor.

Note that FIG. 12A illustrates an example in which the display portion 9631a and the display portion 9631b have the same display area; however, without limitation thereon, one of the display portions may be different from the other display portion in size and display quality. For example, one of them may be a display panel that can display higher-definition images than the other.

The tablet terminal is closed in FIG. 12B. The tablet terminal includes the housing 9630, a solar cell 9633, a charge/discharge control circuit 9634, a battery 9635, and a DCDC converter 9636. Note that in FIG. 12B, a structure including a battery 9635 and a DCDC converter 9636 is illustrated as an example of the charge/discharge control circuit 9634.

Since the tablet can be folded in two, the housing 9630 can be closed when the tablet is not in use. Thus, the display portions 9631a and 9631b can be protected, thereby providing a tablet with high endurance and high reliability for long-term use.

In addition, the tablet terminal illustrated in FIGS. 12A and 12B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633, which is provided on the surface of the tablet terminal, supplies power to a touch panel, a display portion, an image signal processor, and the like. Note that the solar cell 9633 can be provided on one or both surfaces of the housing 9630 and the battery 9635 can be charged efficiently. When a lithium ion battery is used as the battery 9635, there is an advantage of downsizing or the like.

Figure 12C:
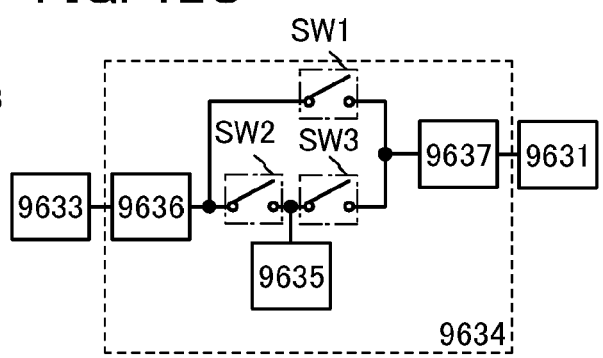

The structure and the operation of the charge/discharge control circuit 9634 illustrated in FIG. 12B are described with reference to a block diagram in FIG. 12C. The solar cell 9633, the battery 9635, the DCDC converter 9636, a converter 9637, switches SW1 to SW3, and the display portion 9631 are illustrated in FIG. 12C, and the battery 9635, the DCDC converter 9636, the converter 9637, and the switches SW1 to SW3 correspond to the charge/discharge control circuit 9634 in FIG. 12B.

First, an example of operation in the case of generating power by the solar cell 9633 using external light is described. The voltage of power generated by the solar cell 9633 is raised or lowered by the DCDC converter 9636 so that a voltage for charging the battery 9635 is obtained. When the display portion 9631 is operated with the power from the solar cell 9633, the switch SW1 is turned on and the voltage of the power is raised or lowered by the converter 9637 to a voltage needed for operating the display portion 9631. In addition, when display on the display portion 9631 is not performed, the switch SW1 may be turned off and a switch SW2 may be turned on so that the battery 9635 is charged.

Here, the solar cell 9633 is given as an example of a power generation means; however, there is no particular limitation on a way of charging the battery 9635, and the battery 9635 may be charged with another power generation means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

Figure 13A:
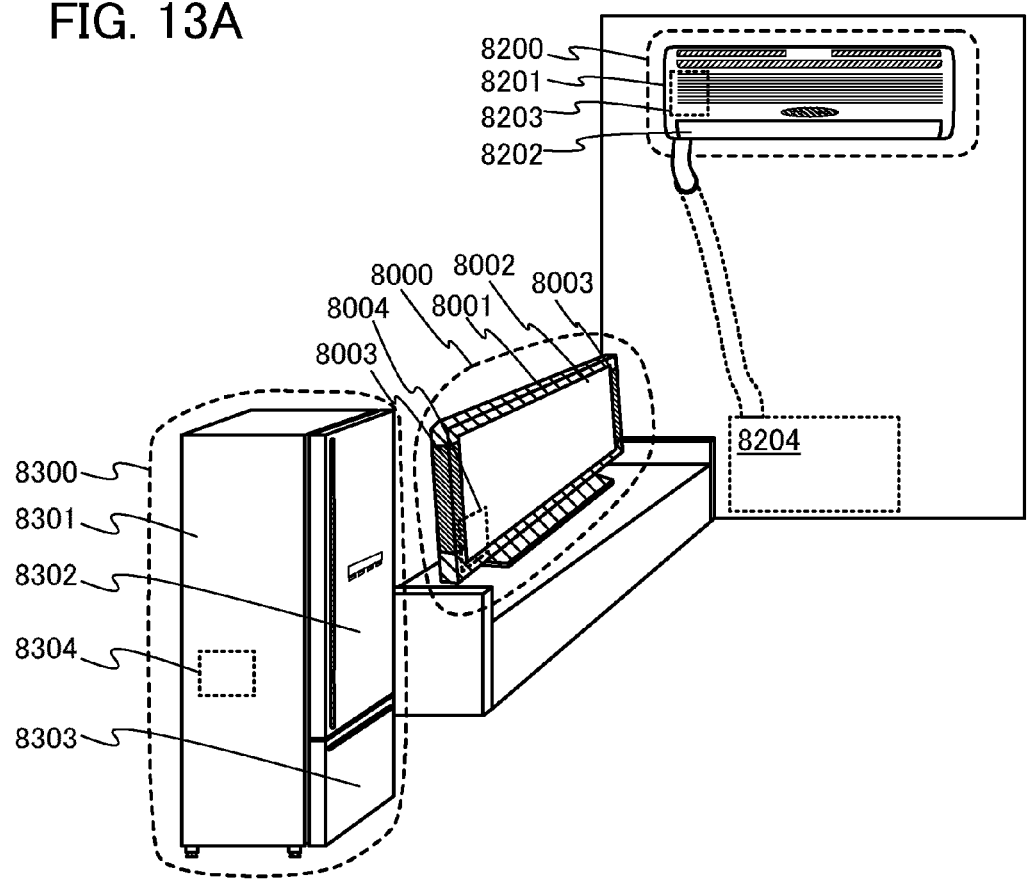
FIGS. 13A to 13C illustrate electronic devices.

In a television set 8000 in FIG. 13A, a display portion 8002 is incorporated in a housing 8001. The display portion 8002 displays an image and a speaker portion 8003 can output sound. The transistor described in Embodiment 1 can be used for the display portion 8002.

A semiconductor display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

The television set 8000 may be provided with a receiver, a modem, and the like. With the receiver, general television broadcasting can be received. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The integrated circuit, the memory, or the CPU described in any of Embodiment 2 to 4 can be used for the television set 8000.

In FIG. 13A, an air conditioner which includes an indoor unit 8200 and an outdoor unit 8204 is an example of an electrical appliance in which the CPU of Embodiment 4 is used. Specifically, the indoor unit 8200 includes a housing 8201, an air outlet 8202, a CPU 8203, and the like. Although the CPU 8203 is provided in the indoor unit 8200 in FIG. 13A, the CPU 8203 may be provided in the outdoor unit 8204. Alternatively, the CPU 8203 may be provided in both the indoor unit 8200 and the outdoor unit 8204. Since the CPU described in Embodiment 4 is a CPU in which an oxide semiconductor is used, an air conditioner having excellent heat resistance property and high reliability can be provided with the use of the CPU.

In FIG. 13A, an electric refrigerator-freezer 8300 is an example of an electrical appliance which is provided with the CPU using an oxide semiconductor. Specifically, the electric refrigerator-freezer 8300 includes a housing 8301, a door for a refrigerator 8302, a door for a freezer 8303, a CPU 8304, and the like. In FIG. 13A, the CPU 8304 is provided in the housing 8301. When the CPU described in Embodiment 4 is used as the CPU 8304 of the electric refrigerator-freezer 8300, power saving can be achieved.

Figure 13B:
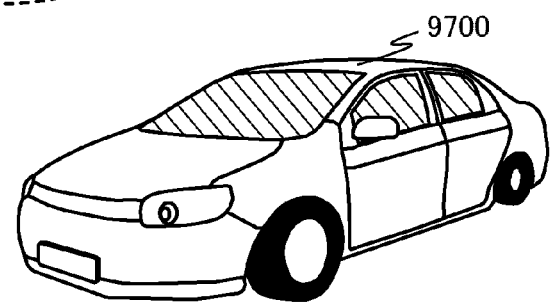
Figure 13C:
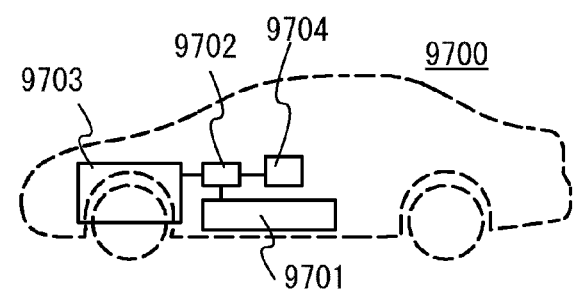

FIGS. 13B and 13C illustrate an example of an electric vehicle which is an example of an electrical appliance. An electric vehicle 9700 is equipped with a secondary battery 9701. The output of power of the non-aqueous secondary battery 9701 is adjusted by a control circuit 9702 and the power is supplied to a driving device 9703. The control circuit 9702 is controlled by a processing unit 9704 including a ROM, a RAM, a CPU, or the like which is not illustrated. When the CPU described in Embodiment 4 is used as the CPU in the electric vehicle 9700, power saving can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

The structures, methods, and the like described in this embodiment can be combined as appropriate with any of the other structures, methods, and the like described in the other embodiments.

Example

In this example, etching characteristics of an oxide semiconductor film containing indium, gallium, and zinc as main components and an oxide film containing indium, gallium, zinc, and nitrogen as main components, which are used for a semiconductor device disclosed in this specification, were evaluated.

An IGZO film with a thickness of 500 nm was formed as an oxide semiconductor film containing indium, gallium, and zinc as main components over a glass substrate by a sputtering method using an oxide target with the following atomic ratio of In:Ga:Zn=1:1:1. Deposition conditions were as follows: an atmosphere of argon and oxygen (argon:oxygen=30 sccm:15 sccm), a pressure of 0.4 Pa, a power of 0.5 kW, and a distance between the substrate and the target of 60 mm Note that two conditions of substrate temperatures in deposition were set, so that an IGZO film formed at a substrate temperature of 200° C. and an IGZO film formed at a substrate temperature of 400° C. were manufactured.

An IGZON film with a thickness of 100 nm was formed as an oxide film containing indium, gallium, zinc, and nitrogen as main components over a glass substrate by a sputtering method using an oxide target with the following atomic ratio of In:Ga:Zn=1:1:1. Deposition conditions were as follows: an atmosphere of nitrogen (nitrogen=40 sccm), a pressure of 0.4 Pa, a power of 0.5 kW, and a distance between the substrate and the target of 60 mm Note that two conditions of substrate temperatures in deposition were set, so that an IGZON film formed at a substrate temperature of 200° C. and an IGZON film formed at a substrate temperature of 400° C. were manufactured.

Figure 14A:
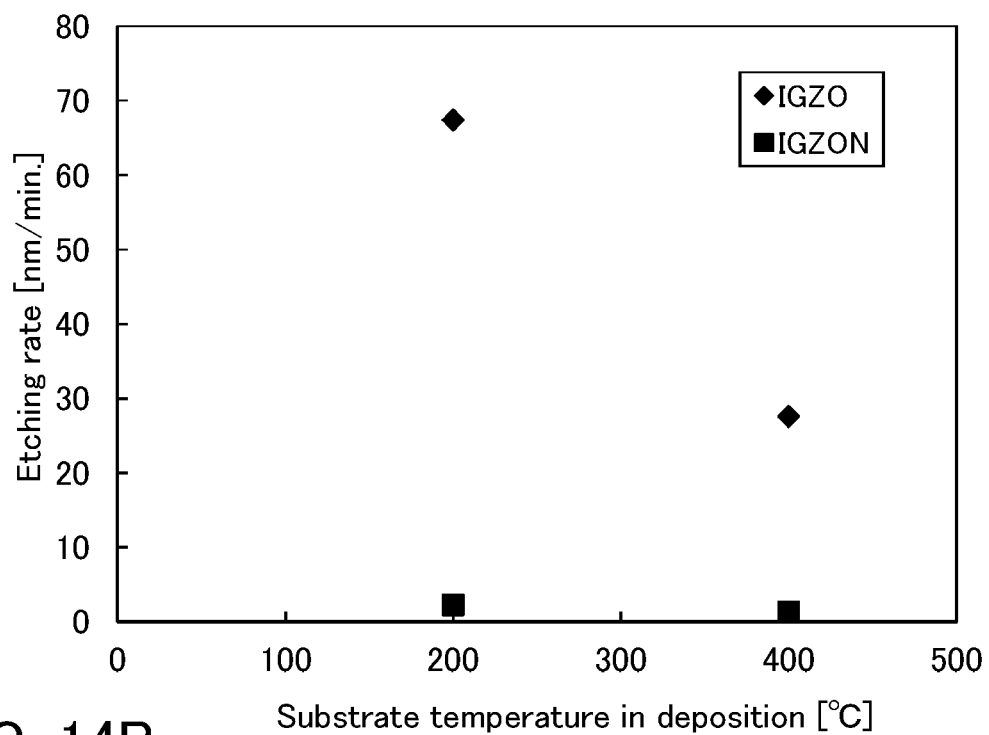
FIGS. 14A and 14B show evaluation results of etching characteristics of samples in Example.

An etching step was performed at room temperature on each of the four kinds of IGZO films and IGZON films using a mixed solution of phosphoric acid, acetic acid, and nitric acid (an aluminum mixed acid solution (an aqueous solution containing 2.0 wt % nitric acid, 9.8 wt % acetic acid, and 72.3 wt % phosphoric acid) produced by Wako Pure Chemical Industries, Ltd.), and the etching rates were evaluated. In FIG. 14A, the etching rates of the four kinds of IGZO films (rhombic dots) and IGZON films (quadrangular dots) are shown. Note that in FIG. 14A, the horizontal axis represents the substrate temperature in deposition (° C.) and the vertical axis represents the etching rate (nm/min). The etching rate of the IGZO film formed at a substrate temperature of 200° C. is approximately 67 nm/min, the etching rate of the IGZO film formed at a substrate temperature of 400° C. is approximately 28 nm/min, the etching rate of the IGZON film formed at a substrate temperature of 200° C. is approximately 2 nm/min, and the etching rate of the IGZON film formed at a substrate temperature of 400° C. is approximately 1 nm/min. The etching rates of the IGZON films are lower than those of the IGZO films regardless of the temperature in deposition.

Figure 14B:
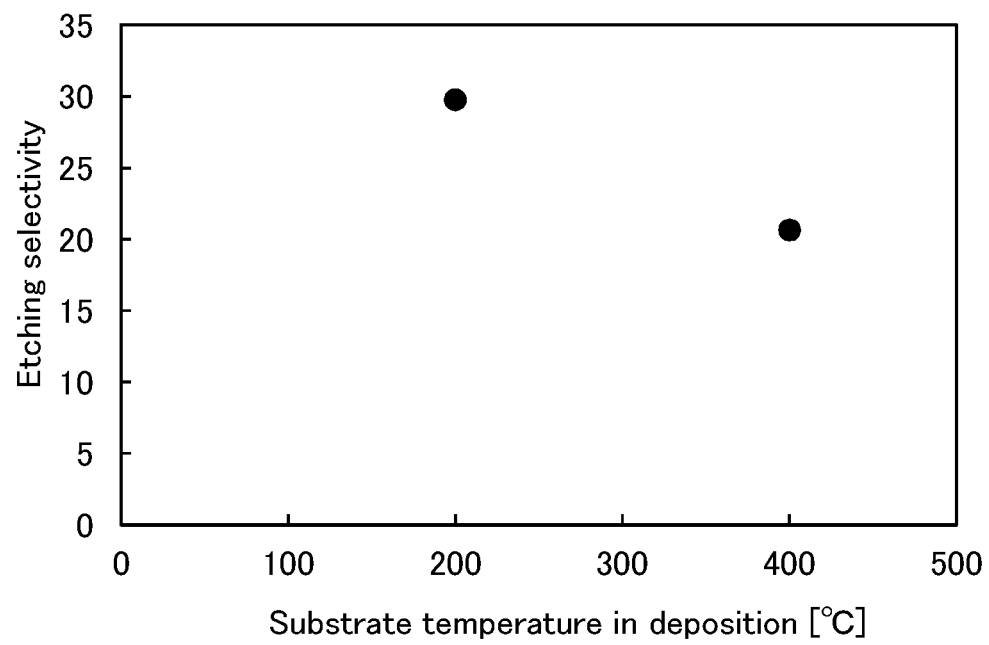

From the etching rates of FIG. 14A, etching selectivity (the etching rate of the IGZO film/the etching rate of the IGZON film) of the IGZO film with respect to the IGZON film which are formed at the same substrate temperature in deposition was calculated. The etching selectivity is shown in FIG. 14B. Note that in FIG. 14B, the horizontal axis indicates the substrate temperature in deposition (° C.) and the vertical axis indicates the etching selectivity. The etching selectivity at the time when the substrate temperature in deposition is 200° C. is approximately 30 and the etching selectivity at the time when the substrate temperature in deposition is 400° C. is approximately 20. It was confirmed that high etching selectivity of 20 or more can be obtained in both cases.

As described above, an oxide semiconductor film (IGZO film) containing indium, gallium, and zinc as main components and an oxide film (IGZON film) containing indium, gallium, zinc, and nitrogen as main components have selectivity in an etching step using a mixed solution of phosphoric acid, acetic acid, and nitric acid; therefore, a microfabrication can be achieved using the selectivity, so that a column object with a small width of the oxide semiconductor film (IGZO film) containing indium, gallium, and zinc as main components and the oxide film (IGZON film) containing indium, gallium, zinc, and nitrogen as main components can be manufactured. Accordingly, by using a minute transistor including the column object with a small width, a semiconductor device can be highly integrated.

This application is based on Japanese Patent Application serial no. 2012-104279 filed with Japan Patent Office on Apr. 30, 2012, the entire contents of which are hereby incorporated by reference.

What is claimed is:

1. A method for manufacturing a semiconductor device, comprising the steps of:
    forming a first electrode layer;
    forming a first oxide film over the first electrode layer;
    forming an oxide semiconductor film over the first oxide film;
    forming a second oxide film over the oxide semiconductor film;
    etching the oxide semiconductor film and the second oxide film to form a column object of the oxide semiconductor film and the second oxide film over the first oxide film;
    forming an insulating film over the column object;
    forming an island-shaped conductive film over the insulating film;
    anisotropically etching the insulating film and the island-shaped conductive film to form a gate insulating film and a gate electrode layer, and to expose the second oxide film of the column object; and
    forming a second electrode layer electrically connected to the second oxide film of the column object.

2. The method for manufacturing the semiconductor device according to claim 1,
    wherein a mixed solution of acetic acid, nitric acid, and phosphoric acid is used in the step of etching the oxide semiconductor film and the second oxide film to form the column object, and
    wherein the second oxide film is used as a mask while being receded in a line width direction in the step of etching the oxide semiconductor film and the second oxide film to form the column object.

3. The method for manufacturing the semiconductor device according to claim 1, wherein a part of the first oxide film is etched in the step of anisotropically etching the oxide semiconductor film and the second oxide film.

4. The method for manufacturing the semiconductor device according to claim 1,
    wherein an interlayer insulating film is formed over the first oxide film, the column object, the gate insulating film, and the gate electrode layer,
    wherein the second oxide film of the column object is exposed by removing the interlayer insulating film, and
    wherein the second electrode layer is formed in contact with the exposed second oxide film.

5. The method for manufacturing the semiconductor device according to claim 1, wherein the first oxide film and the second oxide film have a higher resistance property to etching using the mixed solution of acetic acid, nitric acid, and phosphoric acid and an etching speed is later than the oxide semiconductor film.

6. The method for manufacturing the semiconductor device according to claim 1,
    wherein the first oxide film and the second oxide film have lower resistance than the oxide semiconductor film,
    wherein the oxide semiconductor film functions as a channel formation region, and
    wherein the first oxide film and the second oxide film function as a source region and a drain region.

7. The method for manufacturing the semiconductor device according to claim 1, further comprising the steps of:
    anisotropically etching the oxide semiconductor film and the second oxide film by using a resist mask before etching the oxide semiconductor film and the second oxide film to form the column object.

8. The method for manufacturing the semiconductor device according to claim 1, wherein the second oxide film is formed by a sputtering method in which a target containing indium, gallium, zinc, and nitrogen as main components is used.

9. The method for manufacturing the semiconductor device according to claim 1, wherein the second oxide film is formed by forming an oxide film containing indium, gallium, and zinc as main components and introducing nitrogen to the oxide film.

10. A method for manufacturing a semiconductor device, comprising the steps of:
    forming a first electrode layer;
    stacking a first oxide film containing indium, gallium, zinc, and nitrogen as main components, an oxide semiconductor film containing indium, gallium, and zinc as main components, and a second oxide film containing indium, gallium, zinc, and nitrogen as main components in this order;
    forming a column object of the oxide semiconductor film and the second oxide film by etching the oxide semiconductor film in an etching step using a mixed solution of acetic acid, nitric acid, and phosphoric acid using the second oxide film as a mask while being receded in a line width direction, the column object standing over the first oxide film;

forming a gate insulating film covering at least a side of the oxide semiconductor film of the column object and a first gate electrode layer and a second gate electrode layer which overlap with the oxide semiconductor film of the column object with the gate insulating film provided between the oxide semiconductor film and the first gate electrode layer and between the oxide semiconductor film and the second gate electrode layer and facing each other by stacking an insulating film and an island-shaped conductive film over the column object and anisotropically etching the insulating film and the island-shaped conductive film; and forming a second electrode layer electrically connected to the second oxide film of the column object.

11. The method for manufacturing the semiconductor device according to claim 10, wherein an interlayer insulating film is formed over the first electrode layer, the first oxide film, the column object, the gate insulating film, the first gate electrode layer, and the second gate electrode layer, wherein the second oxide film of the column object is exposed by selectively removing the interlayer insulating film, and wherein the second electrode layer is formed in contact with the exposed second oxide film.

12. The method for manufacturing the semiconductor device according to claim 10, wherein the first oxide film and the second oxide film have a higher resistance property to etching using the mixed solution of acetic acid, nitric acid, and phosphoric acid and an etching speed is later than the oxide semiconductor film.

13. The method for manufacturing the semiconductor device according to claim 10, wherein the first oxide film and the second oxide film have lower resistance than the oxide semiconductor film, wherein the oxide semiconductor film functions as a channel formation region, and wherein the first oxide film and the second oxide film function as a source region and a drain region.

14. The method for manufacturing the semiconductor device according to claim 10, wherein a resist mask is formed over the oxide semiconductor film and the second oxide film before the etching step and the oxide semiconductor film and the second oxide film are each processed into an island shape through an anisotropic etching step using the resist mask.

15. The method for manufacturing the semiconductor device according to claim 10, wherein the second oxide film is formed by a sputtering method in which a target containing indium, gallium, zinc, and nitrogen as main components is used.

16. The method for manufacturing the semiconductor device according to claim 10, wherein the second oxide film is formed by forming an oxide film containing indium, gallium, and zinc as main components and introducing nitrogen to the oxide film.

17. A semiconductor device comprising:
a first electrode layer;
a first oxide film over the first electrode layer;
an oxide semiconductor film over the first oxide film;
a second oxide film over the oxide semiconductor film;
a gate insulating film and a gate electrode layer covering a side surface of the oxide semiconductor film wherein the gate insulating film is between the oxide semiconductor film and the gate electrode layer; and
a second electrode layer over the second oxide film.
wherein the first oxide film contains indium, gallium, zinc, and nitrogen as main components,
wherein the oxide semiconductor film contains indium, gallium, and zinc as main components, and
wherein the second oxide film contains indium, gallium, zinc, and nitrogen as main components.

18. The semiconductor device according to claim 17, wherein an interlayer insulating film is between the first electrode layer and the second electrode layer.

19. The semiconductor device according to claim 17,
wherein the first oxide film and the second oxide film have lower resistance than the oxide semiconductor film,
wherein the oxide semiconductor film functions as a channel formation region, and
wherein the first oxide film and the second oxide film function as a source region and a drain region.

* * * * *